(12) United States Patent
Lee et al.

(10) Patent No.: US 10,679,705 B2
(45) Date of Patent: Jun. 9, 2020

(54) CONTROLLER AND OPERATING METHOD THEREOF

(71) Applicant: SK hynix Inc., Gyeonggi-do (KR)

(72) Inventors: Geu Rim Lee, Gyeonggi-do (KR); Young Gyun Kim, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 135 days.

(21) Appl. No.: 15/879,517

(22) Filed: Jan. 25, 2018

(65) Prior Publication Data

US 2018/0374539 A1 Dec. 27, 2018

(30) Foreign Application Priority Data

Jun. 27, 2017 (KR) .................. 10-2017-0081376

(51) Int. Cl.
| | |
|---|---|
| *G11C 16/10* | (2006.01) |
| *G06F 11/10* | (2006.01) |
| *G06F 12/02* | (2006.01) |
| *G11C 7/10* | (2006.01) |
| *G11C 16/26* | (2006.01) |
| *G11C 16/04* | (2006.01) |
| *G11C 11/56* | (2006.01) |

(52) U.S. Cl.
CPC ........ *G11C 16/105* (2013.01); *G06F 11/1016* (2013.01); *G06F 11/1048* (2013.01); *G06F 12/0246* (2013.01); *G11C 7/1006* (2013.01); *G11C 11/5642* (2013.01); *G11C 16/0483* (2013.01); *G11C 16/26* (2013.01); *G06F 2212/1016* (2013.01); *G06F 2212/1032* (2013.01); *G06F 2212/7208* (2013.01); *G06F 2212/7211* (2013.01); *G11C 2216/16* (2013.01)

(58) Field of Classification Search
CPC ... G11C 16/105; G06F 3/0679; G06F 3/0688; G06F 12/0238; G06F 12/0246; G06F 2212/1032; G06F 2212/2022; G06F 2212/214; G06F 2212/72; G06F 2212/7206; G06F 2212/7211
See application file for complete search history.

(56) References Cited

U.S. PATENT DOCUMENTS

| | | | | |
|---|---|---|---|---|
| 7,818,525 B1* | 10/2010 | Frost | ................... | G06F 12/0246 365/185.25 |
| 9,098,416 B2 | 8/2015 | Mataya et al. | | |
| 2010/0332895 A1* | 12/2010 | Billing | ................ | G06F 11/1008 714/6.13 |

(Continued)

FOREIGN PATENT DOCUMENTS

KR 1020150002069 1/2015

*Primary Examiner* — Tuan V Thai
*Assistant Examiner* — Alexander J Yoon
(74) *Attorney, Agent, or Firm* — IP & T Group LLP

(57) ABSTRACT

A controller controls a semiconductor memory device including a plurality of memory blocks. The controller may include a controller control unit and a storing unit. The controller control unit compares the number of times of a read of an original memory block among the plurality of memory blocks with a predetermined copy generation reference value, determines whether to generate copy data of original data stored in the original memory block, and generates a command corresponding to the determination. The storage unit stores the copy generation reference value and address information about the original memory block.

18 Claims, 24 Drawing Sheets

(56) References Cited

U.S. PATENT DOCUMENTS

| | | | |
|---|---|---|---|
| 2012/0239990 A1* | 9/2012 | Mataya | G06F 12/0866 714/704 |
| 2013/0138871 A1* | 5/2013 | Chiu | G06F 12/0246 711/103 |
| 2015/0006792 A1* | 1/2015 | Lee | G06F 12/0246 711/103 |
| 2018/0032256 A1* | 2/2018 | Kimura | G06F 3/0604 |

* cited by examiner

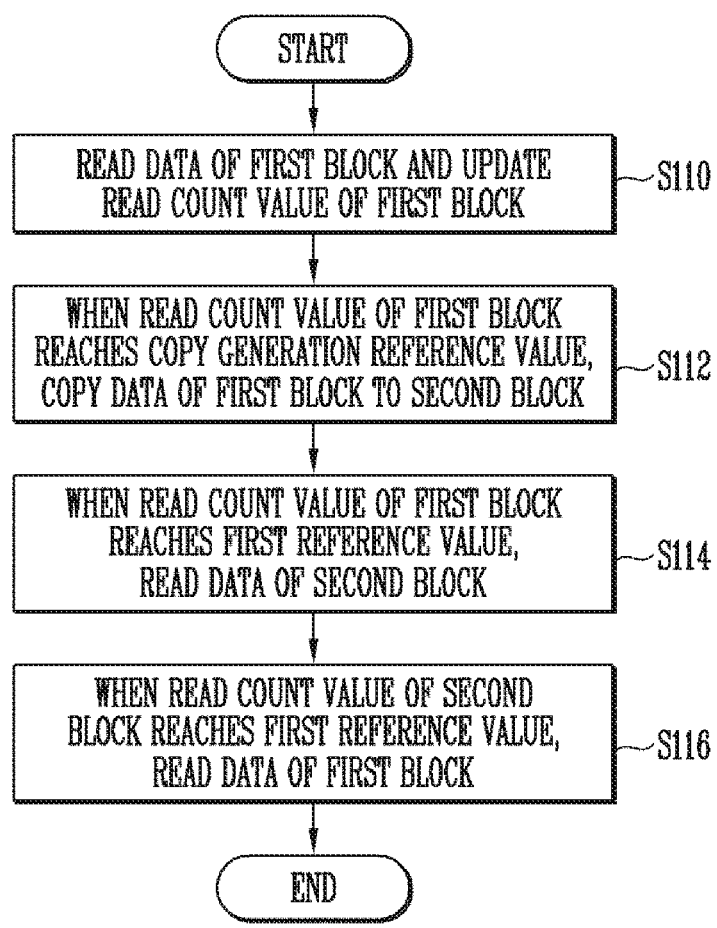

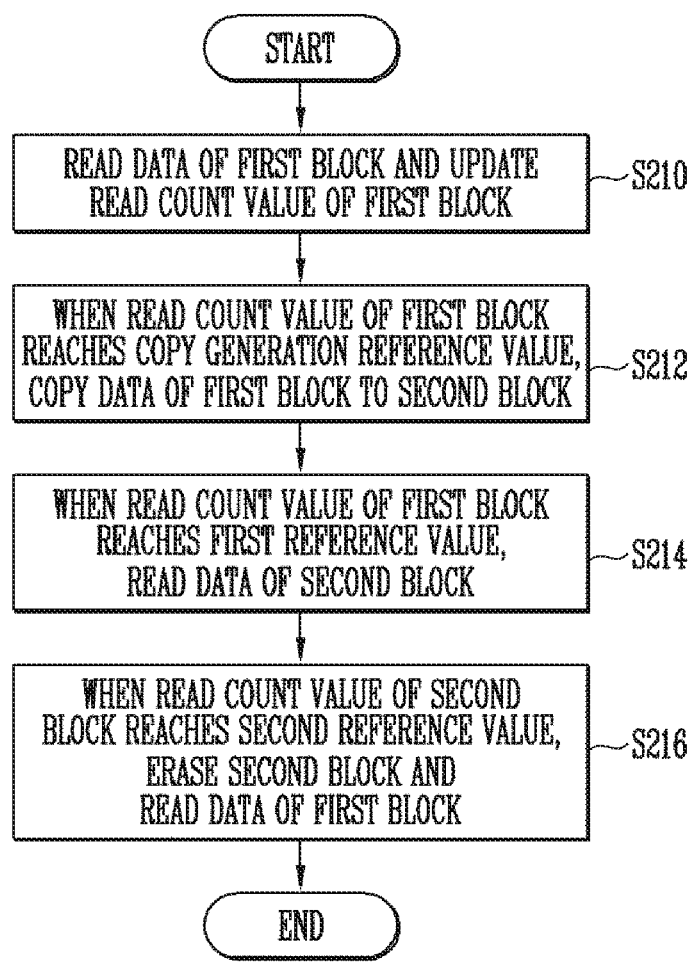

CONTROLLER AND OPERATING METHOD THEREOF

CROSS-REFERENCE TO RELATED APPLICATION

The present application claims priority under 35 U.S.C. § 119(a) to Korean patent application number 10-2017-0081376, filed on Jun. 27, 2017, which is incorporated herein by reference in its entirety.

BACKGROUND

1. Field of Invention

Various exemplary embodiments of the present disclosure generally relate to an electronic device. Particularly, the various exemplary embodiments relate to a controller which controls a semiconductor memory device and an operating method thereof.

2. Description of Related Art

A memory device may be formed in a two-dimensional (2D) structure, in which strings are horizontally arranged on a semiconductor substrate, or a three-dimensional (3D) structure, in which strings are vertically stacked on a semiconductor substrate. The 3D memory device is a memory device conceived in order to solve an integration limitation of the 2D memory device, and may include a plurality of memory cells vertically stacked on the semiconductor substrate.

SUMMARY

The present disclosure provides a controller which controls a semiconductor memory device so that the semiconductor memory device is more reliably operated.

The present disclosure provides an operating method of a controller which controls a semiconductor memory device so that the semiconductor memory device is more reliably operated.

An exemplary embodiment of the present disclosure provides a controller which controls a semiconductor memory device including a plurality of memory blocks. The controller may include a controller control unit and a storage unit. The controller control unit compares a read count value of a read of an original memory block among the plurality of memory blocks with a predetermined copy generation reference value, determines whether to generate copy data of original data stored in the original memory block, and generates a command corresponding to the determination. The storage unit stores the copy generation reference value and address information about the original memory block.

Another exemplary embodiment of the present disclosure provides a method of operating a controller which controls a semiconductor memory device. The method may include: controlling the semiconductor memory device so as to read data of a first block, and updating a read count value of the first block; controlling, when the read count value of the first block reaches a predetermined copy generation reference value, the semiconductor memory device to copy the data of the first block to a second block; controlling, when the read count value of the first block reaches a first reference value, the semiconductor memory device to read data of the second block; and controlling, when a read count value of the second block reaches the first reference value, the semiconductor memory device to read the data of the first block.

Yet another exemplary embodiment of the present disclosure provides a method of operating a controller which controls a semiconductor memory device. The method may include: controlling the semiconductor memory device to read data of a first block, and updating a read count value of the first block; controlling, when the read count value of the first block reaches a predetermined copy generation reference value, the semiconductor memory device so as to copy the data of the first block to a second block; controlling, when the read count value of the first block reaches a first reference value, the semiconductor memory device so as to read data of the second block; and controlling, when a read count value of the second block reaches a second reference value that is larger than the first reference value, the semiconductor memory device so as to erase the data of the second block and read the data of first block.

Yet another exemplary embodiment of the present disclosure provides a memory system. The memory system may include: a memory device having first and second memory blocks. The controller may be configured to control the memory device to copy an original data of the first memory block to the second memory block when a read count of the first memory block reaches a first reference value, and to alternately read one of the original data and the copy data whenever each read count of the first and second memory blocks reaches a second reference value. The second reference value may be greater than the first reference value.

According to the exemplary embodiment of the present disclosure, it is possible to provide the controller which controls a semiconductor device so as to be more reliably operated.

According to the exemplary embodiment of the present disclosure, it is possible to provide the method of operating the controller which controls a semiconductor device so as to be more reliably operated.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a flowchart illustrating an operating method of the controller according to the exemplary embodiment of the present disclosure.

FIG. 11 is a flowchart illustrating an operating method of the controller according to another exemplary embodiment of the present disclosure.

DETAILED DESCRIPTION

Figure 1:
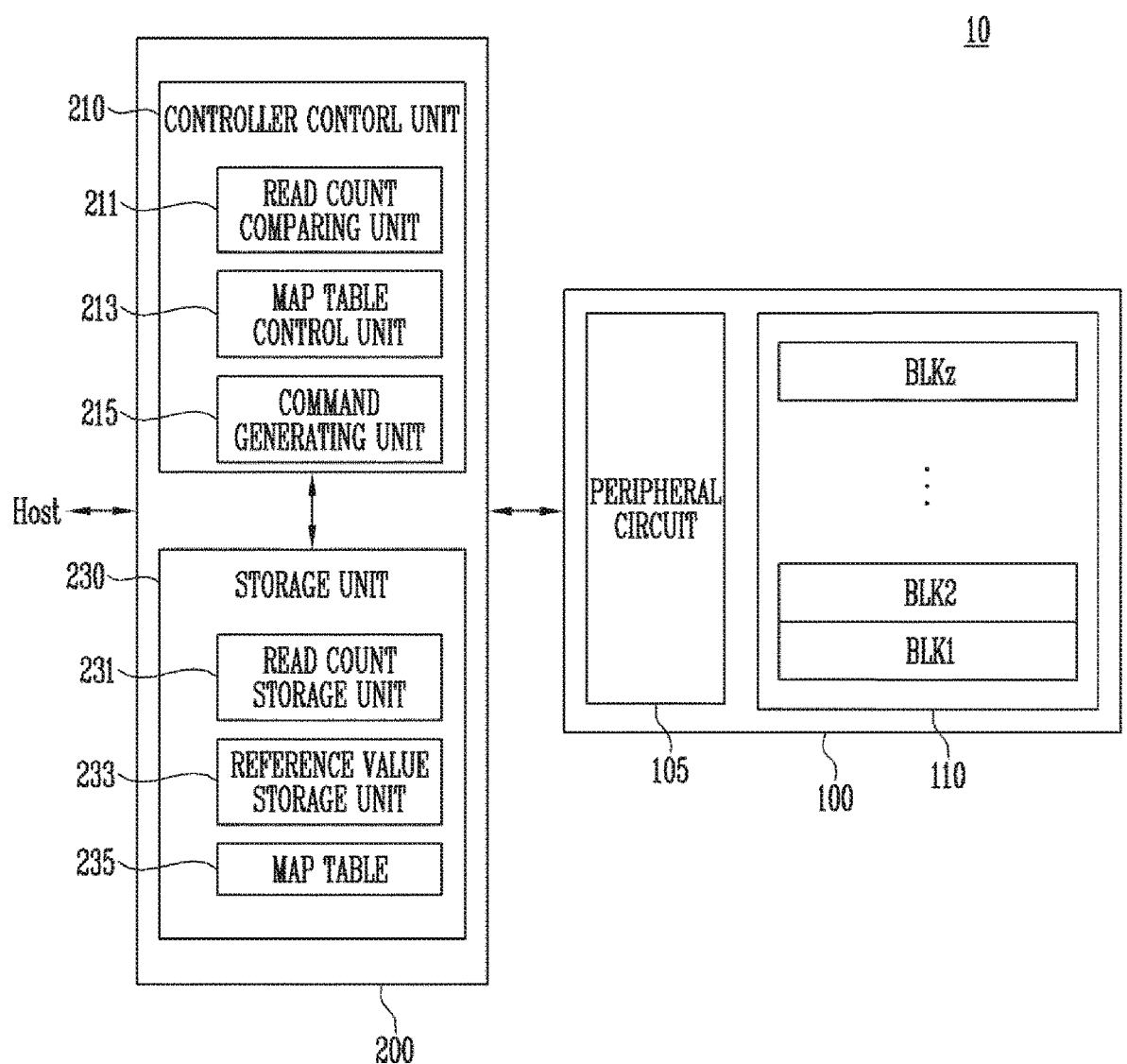
FIG. 1 is a block diagram illustrating a memory system according to an exemplary embodiment of the present disclosure.

Advantages and features of the present disclosure and methods of achieving the advantages and features will be clear with reference to exemplary embodiments described in detail below together with the accompanying drawings. However, the present disclosure is not limited to the exemplary embodiments described herein, and may be implemented in various different forms. However, the exemplary embodiments described herein are provided so as to describe the present disclosure in detail so that those skilled in the art may easily carry out the technical spirit of the present disclosure.

Advantages and features of the present disclosure and methods of achieving the advantages and features will be clear with reference to exemplary embodiments described in detail below together with the accompanying drawings. However, the present disclosure is not limited to the exemplary embodiments described herein, and may be implemented in various different forms. However, the exemplary embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Hereinafter, exemplary embodiments of the present disclosure will be described in detail with reference to the accompanying drawings. In this case, it should be noted that the same elements will be designated by the same reference numerals in the accompanying drawings. Further, in the following description of the present disclosure, a detailed description of known functions and configurations incorporated herein will be omitted when it may make the subject matter of the present disclosure rather unclear.

FIG. 1 is a block diagram illustrating a memory system 10 according to an exemplary embodiment of the present disclosure.

Referring to FIG. 1, the memory system 10 may include a semiconductor memory device 100 and a controller 200.

The semiconductor memory device 100 may operate in response to a control by the controller 200. The semiconductor memory device 100 may include a memory cell array 110, and a peripheral circuit 105 for driving the memory cell array 110. The memory cell array 110 may include a plurality of memory blocks BLK1 to BLKz. Each of the memory blocks BLK1 to BLKz may include a plurality of nonvolatile memory cells.

According to the exemplary embodiment, each memory block may include single level cells or multi-level cells. Each of the memory cells included in a part of the plurality of memory blocks BLK1 to BLKz may be defined as a single level cell storing one bit. The single level cell stores one bit per one memory cell. Each of the memory cells included in another part of the plurality of memory blocks BLK1 to BLKz may be defined as a multi-level cell storing multi-bits. The multi-level cell stores multi-bits per one memory cell. For example, the multi-level cell may store data of two bits per one memory cell. In another exemplary embodiment, each memory block may also include memory cells storing data of three or more bits.

The peripheral circuit 105 is connected to the memory cell array 110. The peripheral circuit 105 may operate in response to a control of the controller 200. The peripheral circuit 105 may program data in the memory cell array 110 in response to the control of the controller 200, fetch data from the memory cell array 110, and erase the data of the memory cell array 110.

According to the exemplary embodiment, a read operation and a program operation of the semiconductor memory device 100 may be performed in a unit of a logical page. An erase operation of the semiconductor memory device 100 may be performed in a unit of a memory block.

During the program operation, the peripheral circuit 105 may receive write data and a physical address number from the controller 200. One memory block and one physical page included in the one memory block may be specified by the physical address number. A logical page within the corresponding physical page may be specified by the physical address number. The peripheral circuit 105 may program write data in the corresponding physical page. For example, the write data may be stored as least significant bits or may be stored as most significant bits of the corresponding physical page.

During the read operation, the peripheral circuit may receive the physical address number from the controller 200. One memory block and one physical page included in the one memory block may be specified by the physical address number. A logical page within the corresponding physical page may be specified by the physical address number. The peripheral circuit 105 may read the least significant bits or the most significant bits from the corresponding physical page, and output the read data to the controller 200.

During the erase operation, the physical address number transmitted from the controller 200 to the peripheral circuit 105 may specify one memory block. The peripheral circuit 105 may erase data of a memory block corresponding to the physical address number. According to the exemplary embodiment, the erase operation may be performed in the unit of the page, not the unit of the block. In this case, a physical page that is an erase target may be specified by the physical address number transmitted from the controller 200 to the peripheral circuit 105. The peripheral circuit 105 may erase data of a physical page corresponding to the physical address number.

According to the exemplary embodiment, the semiconductor memory device 100 may be a flash memory device.

The controller 200 may control general operations of the semiconductor memory device 100. The controller 1100 may access the semiconductor memory device 100 in response to a request from the host Host. For example, the controller 200 may control read, write, erase, and background operations of the semiconductor memory device 100. The controller 200 may provide an interface between the semiconductor memory device 100 and the host Host. The controller 200 may drive firmware (FW) for controlling the semiconductor memory device 100.

The controller 200 may include a controller control unit 210 and a storage unit 230. The controller control unit 210 may compare read count (i.e. number of times of read) of a specific memory block, in which original data is stored among the plurality of memory blocks BLK1 to BLKz, to a predetermined copy generation reference value. The controller control unit 210 may determine whether or not to generate copy data of the original data stored in the original memory block according to a result of the comparison, and generate a command corresponding to the determination. In the meantime, the storage unit 230 may store the copy generation reference value and address information about the original memory block.

The controller control unit 210 may be operated as a Flash Translation Layer (FTL), and may control the storage unit 230. In the meantime, the controller control unit 210 may include a read count comparing unit 211, a map table control unit 213, and a command generating unit 215. The storage unit 230 may include a read count storage unit 231, a reference value storage unit 233, and a map table 235.

The read count comparing unit 211 may receive the copy generation reference value from the reference value storage unit 233, receive the read count value of the original memory block from the read count storage unit 231, and compare the copy generation reference value with the read count value of the original memory block. Here, the read count value may refer to the number of times of the read operation. The map table control unit 213 may store the address information in the map table 235 and update the address information. The command generating unit 215 may generate a command for generating the copy data based on a result of the comparison of the read count comparing unit 211. The command may be transmitted to the semiconductor memory device 100, so that copy data may be stored in a copy memory block. The read count storage unit 231 may store the read count value of the original memory block. The reference value storage unit 233 may store the copy generation reference value. The map table 235 may store the address information about the original memory block.

The map table 235 may include a mapping relation between the pages of the memory blocks BLK1 to BLKz within the memory cell array 110 and the corresponding logical address numbers. The mapping relation may be referred to as the "address information". The map table 235 and the storage unit 230 including the map table 235 may be implemented as a random access memory included in the controller 200. The storage unit 230 may be operated in response to a control of the controller control unit 210. According to the exemplary embodiment, the storage unit 230 may include, for example, a Static RAM (SRAM), a Dynamic RAM (DRAM), a Synchronous DRAM (SDRAM), and the like. Further, the storage unit 230 may be used as an operation memory of the controller control unit 210, in addition to the configuration of the map table 235, the read counter storage unit 233, and the reference value storage unit 233. According to the exemplary embodiment, the storage unit 230 may be used as a buffer memory between the semiconductor memory device 100 and the host Host. For example, during the read operation, the data read from the semiconductor memory device 100 may be temporarily stored in the storage unit 230 and output to the host Host. During the program operation, write data received from the host Host may be temporarily stored in the storage unit 230 and provided to the semiconductor memory device 100.

According to the exemplary embodiment of the present disclosure, when the command generating unit 215 generates a command for generating the copy data, the map table control unit 215 may store address information about a copy memory block, in which the copy data is stored, in the map table 235. In the meantime, the address information about the copy memory block may be additionally stored as corresponding to the address information about the original memory block. In this case, the map table 235 may store information represented in Table 1 below.

TABLE 1

| Data | Logical address | Address of original memory block | Address of copy memory block |
|---|---|---|---|
| Data A | ADDR_L | ADDR_PO | ADDR_PC |

In Table 1, page address and the like other than the block address is omitted. Table 1 represents that data Data A corresponding to a logical address ADDR_L is stored in an original memory block corresponding to an address ADDR_PO and is also stored in a copy memory block corresponding to an address ADDR_PC.

According to the exemplary embodiment, the read count comparing unit 211 may compare the read count value of the original memory block with a predetermined first reference value. In this case, the map table control unit 213 may update the map table 235 so that the copy memory block, in which the copy data is stored, is accessed based on a result of the comparison. Accordingly, when the read count value of the original memory block reaches the predetermined number of times corresponding to the first reference value, the map table control unit 213 refers to the address ADDR_PC for the access to the copy memory block during the future read of the data Data A. Accordingly, it is possible to prevent errors caused by read stress of the memory cells of the original memory block due to repetitive read operations on the original memory block, thereby improving operation reliability of the semiconductor memory device.

Furthermore, the read count comparing unit 211 may compare the read count value of the copy memory block with the first reference value while reading the copy data by referring to the copy memory block. Further, the map table control unit 213 may update the map table 235 so that the original memory block, in which the original data is stored, is accessed based on a result of the comparison. Accordingly, when the number of times of the read operation for the copy memory block reaches the first reference value, the map table control unit 213 refers to the address ADDR_PO for the access to the original memory block again during the future read of the data Data A. Therefore, it is possible to prevent errors caused by read stress of the memory cells of the copy memory block due to repetitive read operations on the copy memory block, thereby improving operation reliability of the semiconductor memory device.

A detailed operation of the controller 200 according to the exemplary embodiment of the present disclosure will be described with reference to FIGS. 6A to 17 below.

Figure 2:
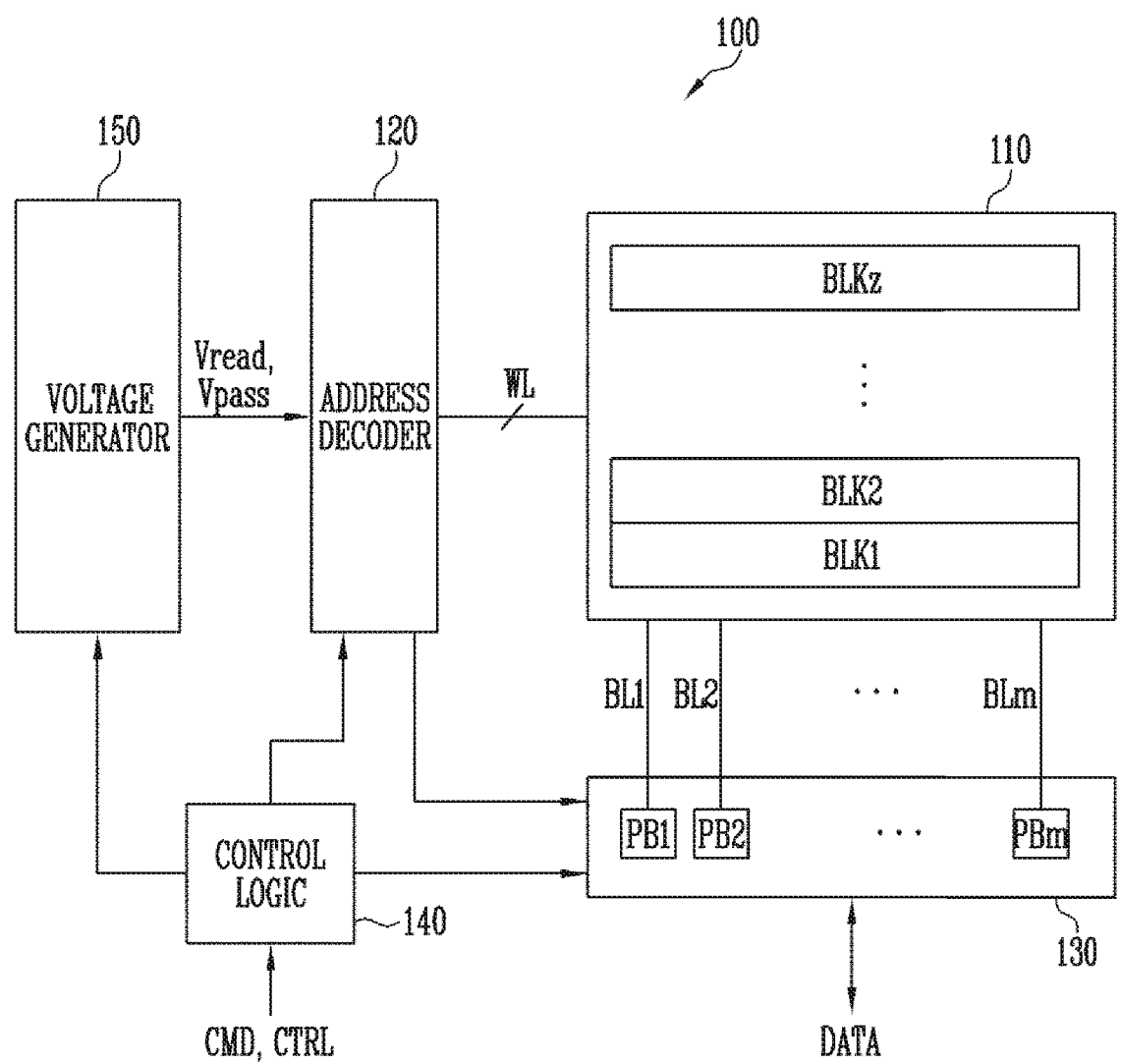
FIG. 2 is a block diagram illustrating an exemplary embodiment of a semiconductor memory device of FIG. 1.

FIG. 2 is a block diagram illustrating an exemplary embodiment of the semiconductor memory device 100 of FIG. 1.

Referring to FIG. 2, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz are connected to the address decoder 120 through word lines WLs. The plurality of memory blocks BLK1 to BLKz are connected to the read and write circuit 130 through bit lines BL1 to BLm. Each of the memory blocks BLK1 to BLKz may include a plurality of memory cells. In the exemplary embodiment, the plurality of memory cells may be non-volatile memory cells, and may be formed of the non-volatile memory cells having a vertical channel structure. The memory cell array 110 may be formed of a memory cell array having a 2D structure. However, depending on an exemplary embodiment, the memory cell array 110 may be formed of a memory cell array having a 3D structure. Each of the plurality of memory cells included in the memory cell array may store data of at least one bit. According to the exemplary embodiment, each of the plurality of memory cells included in the memory cell array 110 may be a single-level cell (SLC) storing data of one bit. However, the present disclosure is not limited thereto. That is, depending on an embodiment, each of the plurality of memory cells included in the memory cell array 110 may be a multi-level cell (MLC) storing data of two bits, a triple-level cell storing data of three bits, a quad-level cell storing data of four bits, or include a plurality of memory cells each of which stores data of five or more bits.

The address decoder 120, the read and write circuit 130, the control logic 140, and the voltage generator 150 are operated as peripheral circuits driving the memory cell array 110. The peripheral circuit may correspond to the peripheral circuit 105 described with reference to FIG. 1. The address decoder 120 is connected to the memory cell array 110 through the word lines WLs. The address decoder 120 may operate in response to a control by the control logic 140. The address decoder 120 may receive an address through an input/output buffer (not illustrated) inside the semiconductor memory device 100.

The address decoder 120 may decode a block address among received addresses. The address decoder 120 selects at least one memory block according to the decoded block address. Further, during a read voltage application operation in a read operation, the address decoder 120 applies a read voltage Vread generated from the voltage generator 150 to a selected word line in a selected memory block and applies a pass voltage Vpass to the remaining non-selected word lines. Further, during a program verify operation, the address decoder 120 applies a verify voltage generated from the voltage generator 150 to a selected word line in a selected memory block, and applies a pass voltage Vpass to the remaining non-selected word lines.

The address decoder 120 may decode a column address among the received addresses. The address decoder 120 transmits the decoded column address to the read and write circuit 130.

The read operation and the program operation of the semiconductor memory device 100 may be performed in the unit of a page. The address received during a request of the read operation and the program operation may include the block address, a row address, and the column address. The address decoder 120 selects one memory block and one word line according to the block address and the row address. The column address is decoded by the address decoder 120 to be provided to the read and write circuit 130.

The address decoder 120 may include a block decoder, a row decoder, a column decoder, an address buffer, and the like.

The read and write circuit 130 may include a plurality of page buffers PB1 to PBm. The read and write circuit 130 may be operated as a "read circuit" during the read operation of the memory cell array 110, and may be operated as a "write circuit" during the write operation of the memory cell array 110. The plurality of page buffers PB1 to PBm are connected to the memory cell array 110 through the bit lines BL1 to BLm. In order to sense threshold voltages of the memory cells during the read operation and the program verify operation, the plurality of page buffers PB1 to PBm senses a change in the amount of flowing current according to a program state of a corresponding memory cell while continuously supplying a sensing current to the bit lines connected with the memory cells, and latches the detected change in the amount of current as sensing data. The read and write circuit 130 is operated in response to page buffer control signals output from the control logic 140.

The read and write circuit 130 senses data of the memory cell and temporarily stores the read data during the read operation, and then outputs data DATA to the input/output buffer (not illustrated) of the semiconductor memory device 100. According to the exemplary embodiment, the read and write circuit 130 may include a column selection circuit, in addition to the page buffers (or page registers).

The control logic 140 is connected to the address decoder 120, the read and write circuit 130, and the voltage generator 150. The control logic 140 receives a command CMD and a control signal CTRL through the input/output buffer (not illustrated) of the semiconductor memory device 100. The control logic 140 may control a general operation of the semiconductor memory device 100 in response to the control signal CTRL. Further, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to a voltage generator control signal output form the control logic 140.

Figure 3:
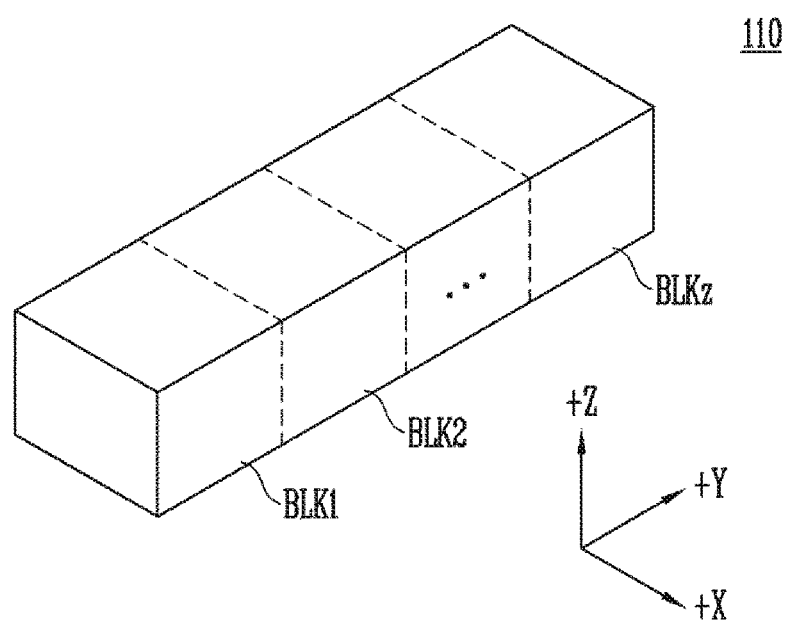
FIG. 3 is a block diagram illustrating an exemplary embodiment of a memory cell array shown in FIG. 2.

FIG. 3 is a block diagram illustrating an exemplary embodiment of the memory cell array of FIG. 2.

Figure 4:
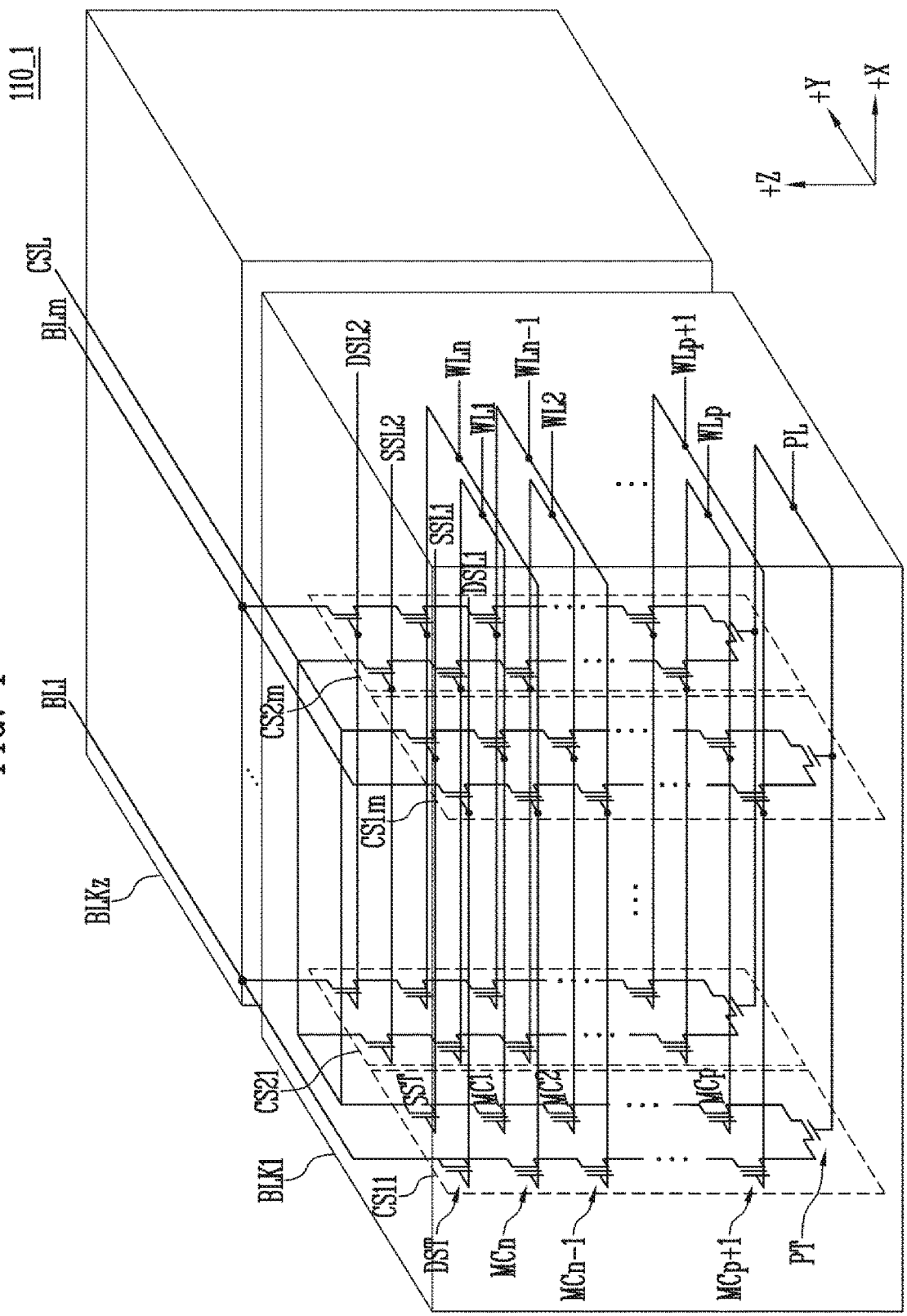
FIG. 4 is a diagram illustrating an exemplary embodiment 110_1 of the memory cell array shown in FIGS. 2 and 3.

Referring to FIG. 3, the memory cell array 110 may include the plurality of memory blocks BLK1 to BLKz. Each memory block may have a 2D or a 3D structure. Each of the memory blocks may include the plurality of memory cells stacked on a substrate. When the memory blocks have a 3D structure, as shown in FIG. 4, the memory cell array 110 may include a plurality of memory blocks BLK1 to BLKz each having a 3D structure (or vertical structure). The plurality of memory cells is arranged in a +X-axis direction, a +Y-axis direction, and a +Z-axis direction. A structure of each memory block formed in the 3D structure will be described in more detail with reference to FIGS. 4 and 5.

FIG. 4 is a diagram illustrating an exemplary embodiment 110_1 of the memory cell array 110 shown in FIGS. 2 and 3.

Referring to FIG. 4, a memory cell array 110_1 may include a plurality of memory blocks BLK1 to BLKz. In FIG. 4, for illustrative purposes and brevity, an internal configuration of only a first memory block BLK1 is illustrated, and the internal configurations of the remaining memory blocks BLK2 to BLKz are omitted. It may be understood that each of the second to $z^{th}$ memory blocks BLK2 to BLKz is configured in the same manner as that of the first memory block BLK1.

Referring to FIG. 4, the first memory block BLK1 may include a plurality of cell strings CS11 to CS1m and CS21 to CS2m. According to the exemplary embodiment, each of the plurality of cell strings CS11 to CS1m and CS21 to CS2m may be formed in a "U" shape. Within the first memory block BLK1, m cell strings are arranged in a row direction (that is, the +X-axis direction). FIG. 4 illustrates that two cell strings are arranged in a column direction (that is, the +Y-axis direction). Although FIG. 4 illustrates only two cell strings arranged in a column direction, it is to be noted that the present disclosure is not limited thereto, and any suitable number of cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The source and drain select transistors SST and DST and the memory cells MC1 to MCn may have similar structures. According to the exemplary embodiment, each of the select transistors SST and DST and the memory cells MC1 to MCn may have a channel layer, a tunneling insulating layer, a charge storing layer, and a blocking insulating layer. According to the exemplary embodiment, a pillar for providing a channel layer may be provided to each cell string. A pillar for providing at least one of the channel layer, the tunneling insulating layer, the charge storing layer, and the blocking insulating layer may be provided to each cell string.

The source select transistor SST of each cell string is connected between the common source line CSL and the memory cells MC1 to MCp.

According to the exemplary embodiment, the source select transistors of the cell strings arranged in the same row are connected to a source select line elongated in the row direction, and the source select transistors of the cell strings arranged in different rows are connected to different source select lines. In FIG. 3B, the source select transistors of the cell strings CS11 to CS1m of a first row are connected to a first source select line SSL1. The source select transistors of the cell strings CS21 to CS2m of a second row are connected to a second source select line SSL2.

According to another exemplary embodiment of the present disclosure, the source select transistors of the cell strings CS11 to CS1m and CS21 to CS2m may be connected in common to one source select line.

The first to $n^{th}$ memory cells MC1 to MCn of each cell string are connected between the source select transistor SST and the drain select transistor DST.

The first to $n^{th}$ memory cells MC1 to MCn may be divided into the first to $p^{th}$ memory cells MC1 to MCp, and the p+1$^{th}$ to $n^{th}$ memory cells MCp+1 to MCn. The first to $p^{th}$ memory cells MC1 to MCp are sequentially arranged in a reverse direction of the +Z-axis direction, and are connected in series between the source select transistor SST and the pipe transistor PT. The p+1$^{th}$ to $n^{th}$ memory cells MCp+1 to MCn are sequentially arranged in the +Z-axis direction, and are connected in series between the pipe transistor PT and the drain select transistor DST. The first to $p^{th}$ memory cells MC1 to MCp and the p+1$^{th}$ to $n^{th}$ memory cells MCp+1 to MCn are connected through the pipe transistor PT. Gates of the first to $n^{th}$ memory cells MC1 to MCn of each cell string are connected to first to $n^{th}$ word lines WL1 to WLn, respectively.

A gate of the pipe transistor PT of each cell string is connected to the pipe line PL.

The drain select transistor DST of each cell string is connected between the corresponding bit line and the memory cells MCp+1 to MCn. The cell strings arranged in the row direction are connected to the drain select line elongated in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit line elongated in the column direction. In FIG. 4, the cell strings CS11 and CS21 of the first column are connected to the first bit line BL1. The cell strings CS1m and CS2m of the m$^{th}$ column are connected to the m$^{th}$ bit line BLm.

The memory cells connected to the same word line within the cell strings arranged in the row direction form one page. For example, the memory cells connected to the first word line WL1 among the cell strings CS11 to CS1m of the first row form one page. The memory cells connected to the first word line WL1 among the cell strings CS21 to CS2m of the second row form another page. The cell strings to be arranged in one row direction will be selected by selecting any one of the drain select lines DSL1 and DSL2. One page among the selected cell strings may be selected by selecting any one of the word lines WL1 to WLn.

Figure 5:
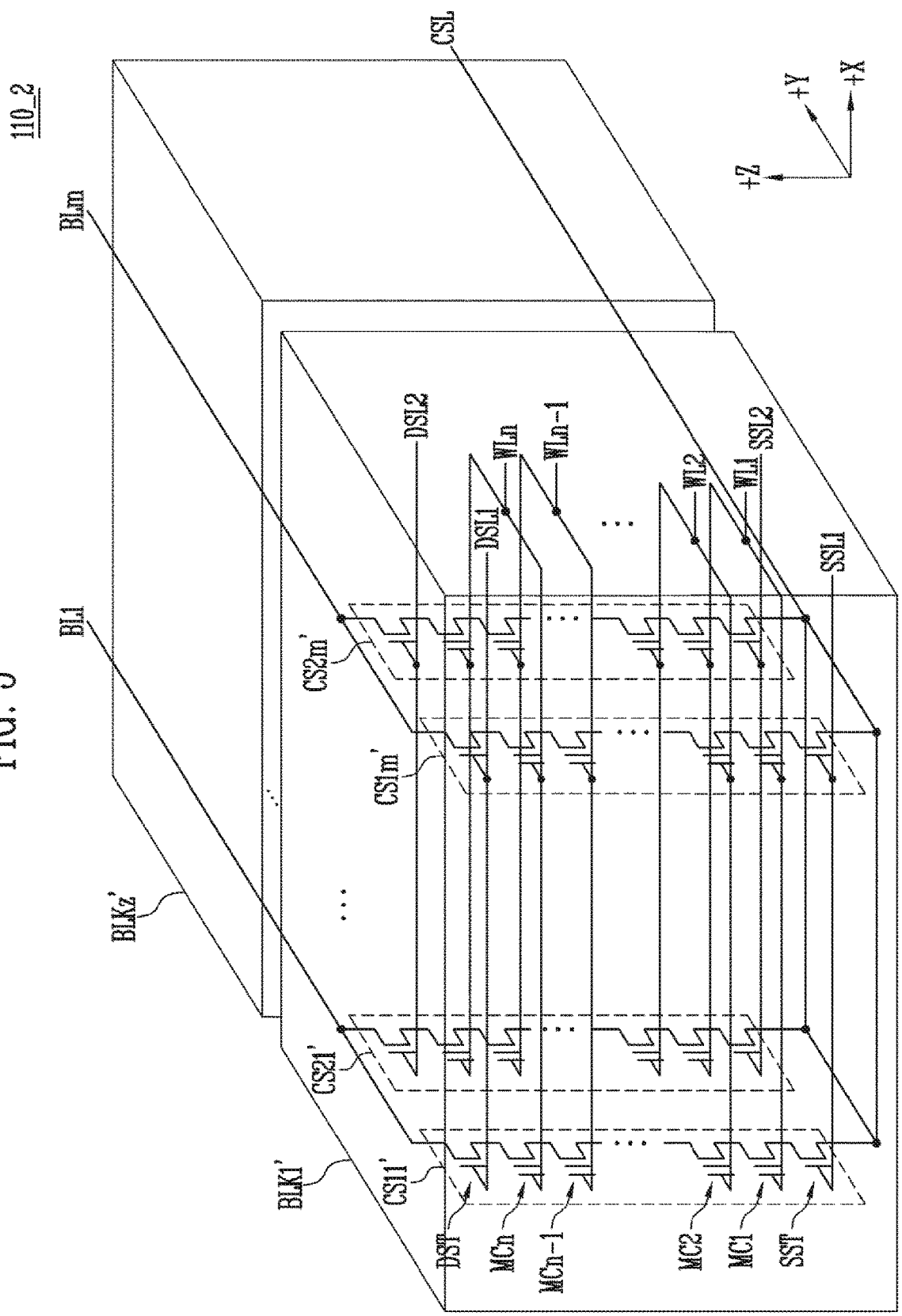
FIG. 5 is a diagram illustrating another exemplary embodiment 110_2 of the memory cell array shown in FIGS. 2 and 3.

FIG. 5 is a diagram illustrating another exemplary embodiment 110_2 of the memory cell array 110 shown in FIGS. 2 and 3.

Referring to FIG. 5, a memory cell array 110_2 may include a plurality of memory blocks BLK1' to BLKz'. In FIG. 5, for illustrative purposes and brevity, an internal configuration of only a first memory block BLK1' is illustrated, and the internal configurations of the remaining memory blocks BLK2' to BLKz' are omitted. It may be understood that each of the second to $z^{th}$ memory blocks BLK2' to BLKz' is configured in the same manner as that of the first memory block BLK1'.

The first memory block BLK1' may include a plurality of cell strings CS11' to CS1m' and CS21' to CS2m'. Each of the plurality of cell strings CS11' to CS1m' and CS21' to CS2m' is elongated in the +Z-axis direction. Within the first memory block BLK1', m cell strings may be arranged in the +X-axis direction. Although FIG. 5 illustrates only two cell strings arranged in a column direction, it is to be noted that the present disclosure is not limited thereto, and any suitable number of cell strings may be arranged in the column direction.

Each of the plurality of cell strings CS11' to CS1m' and CS21' to CS2m' may include at least one source select transistor SST, first to $n^{th}$ memory cells MC1 to MCn, and at least one drain select transistor DST.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in the first row are connected to the first source select line SSL1. The source select transistors of the cell strings CS21' to CS2m' arranged in the second row are connected to the second source select line SSL2. According to another exemplary embodiment, the source select transistors of the cell strings CS11' to CS1m' and CS21' to CS2m' may be connected in common to one source select line.

The first to $n^{th}$ memory cells MC1 to MCn of each cell string are connected in series between the source select transistor SST and the drain select transistor DST. Gates of the first to $n^{th}$ memory cells MC1 to MCn are connected to first to $n^{th}$ word lines WL1 to WLn, respectively.

The drain select transistor DST of each cell string is connected between the corresponding bit line and the memory cells MC1 to MCn. The drain select transistors of the cell strings arranged in the row direction are connected to the drain select line elongated in the row direction. The drain select transistors of the cell strings CS11' to CS1m' of the first row are connected to a first drain select line DSL1. The drain select transistors of the cell strings CS21' to CS2m' of the second row are connected to a second drain select line DSL2.

As a result, the memory block BLK1' of FIG. 5 has a circuit substantially similar to that of the memory block BLK1 of FIG. 4, with the exception of the pipe transistor PT being excluded in each cell string.

Figure 6A:
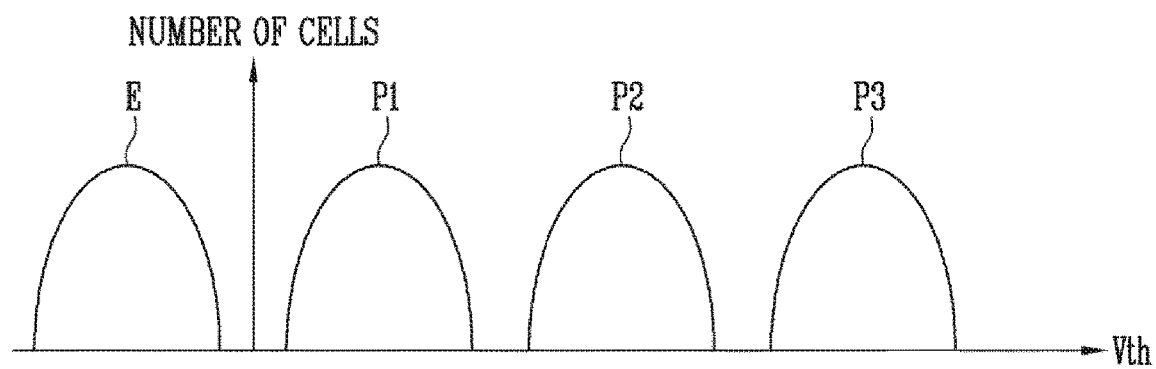
FIG. 6A is a diagram illustrating a threshold voltage distribution of a multi-level cell.
Figure 6B:
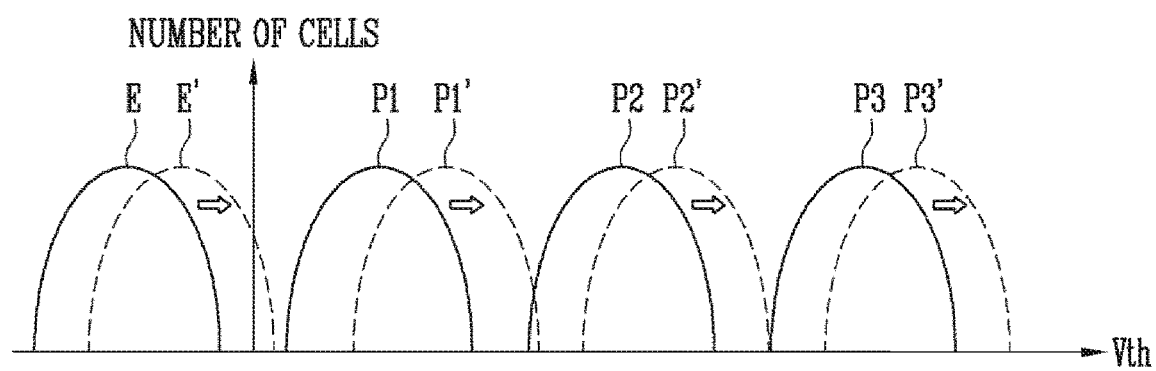
FIG. 6B is a diagram illustrating a change in a threshold voltage distribution according to read stress.
Figure 6C:
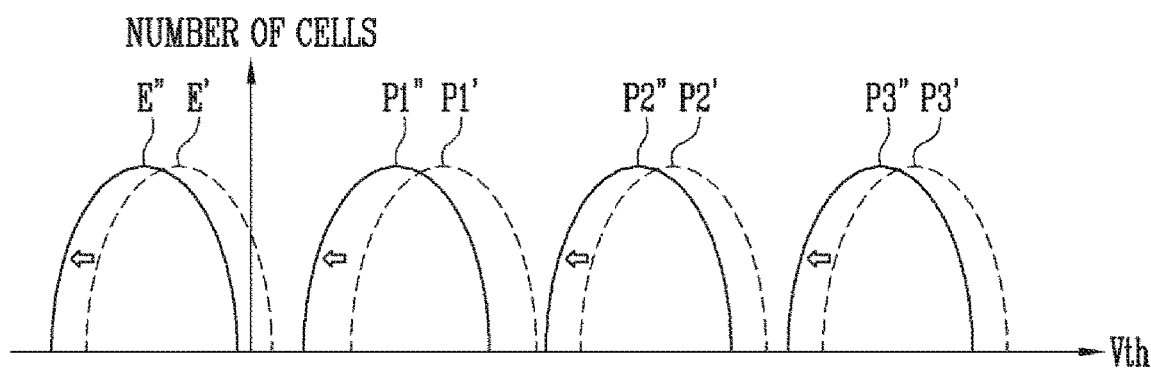
FIG. 6C is a diagram illustrating a change in a threshold voltage distribution according to a retention characteristic of a memory cell according to the lapse of time.

FIG. 6A is a diagram illustrating a threshold voltage distribution of a multi-level cell. FIG. 6B is a diagram illustrating a change in a threshold voltage distribution according to read stress. FIG. 6C is a diagram illustrating a change in a threshold voltage distribution according to a retention characteristic of a memory cell according to the lapse of time.

First, referring to FIG. 6A, threshold voltages corresponding to an erase state E and threshold voltages corresponding to first to third program states P1 to P3 are distributed. In the memory cell array having the 3D structure illustrated in FIGS. 4 and 5, read stress for the adjacent memory cells may be generated during the read operation for a specific memory block. This read stress may change the distributions of the threshold voltages as illustrated in FIG. 6B. That is, the distribution of the threshold voltages corresponding to the erase state E may be changed to a state E, and the distributions of the threshold voltages corresponding to the first to third program states P1 to P3 may also be changed to states P1' to P3'. Accordingly, a read error may be generated during the read operation, thereby degrading operation reliability of the semiconductor memory device.

According to the present embodiment, in the memory block in which the threshold voltage is changed according to the read stress, when a predetermined time elapses, a change in the threshold voltage may be mitigated according to a retention characteristic. The foregoing situation is illustrated in FIG. 6C. The states E, P1, P2, and P3 may be changed to the states E', P1', P2', and P3' according to the read stress, and may be changed to states E", P1", P2", and P3" according to lapse of time. The present disclosure is conceived based on the foregoing characteristic, and the controller according to the present disclosure performs the read operation on the copy memory block when the read count value of the original memory block reaches the predetermined first threshold value, thereby inducing the distribution of the threshold voltages of the original memory block to be changed to a mitigated state as illustrated in FIG. 6C. A detailed operation of the controller 200 according to the present disclosure will be described in detail with reference to FIGS. 7 to 17 below.

FIG. 7 is a flowchart illustrating an operating method of the controller according to the exemplary embodiment of the present disclosure. FIGS. 8A to 8E are diagrams describing the operating method according to FIG. 7.

Referring to FIG. 7, at step S110, the controller 200 controls the semiconductor memory device 100 so as to read data of a first block, and updates a read count value of the first block. Then, at step S112, when the read count value of the first block reaches a predetermined copy generation reference value, the controller 200 controls the semiconductor memory device 100 to copy the original data of the first block to the second block. At step S114, when the read count value of the first block reaches a predetermined first reference value, the controller 200 controls the semiconductor memory device 100 to read the copy data of the second block. At step S116, when the read count value of the second block reaches the first reference value, the controller 200 controls the semiconductor memory device 100 to read the original data of the first block. Hereinafter, the operating method illustrated in FIG. 7 will be described in detail with reference to FIGS. 8A to 8E below.

Figure 8A:
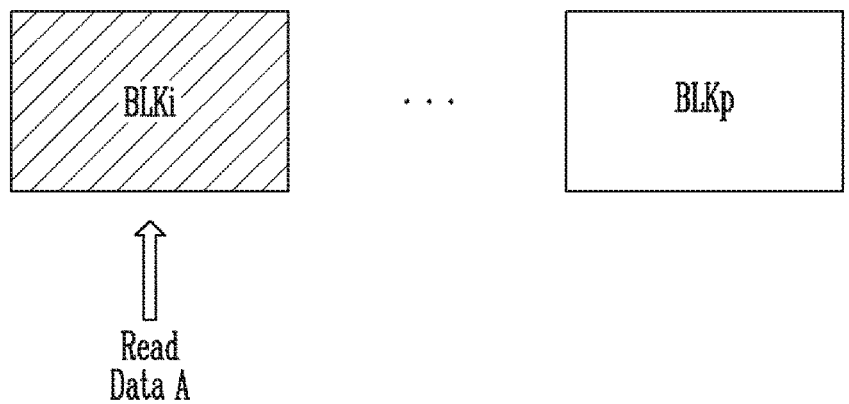
FIGS. 8A to 8E are diagrams describing the operating method according to FIG. 7.

Referring to FIG. 8A, original data Data A is stored in a first block BLKi. When a read request for the original data Data A is made while the read count value of the first block BLKi (hereinafter, referred to as a read count value RC1) is smaller than the copy generation reference value CRV that is a reference value for generating a copy data for the original data Data A, a read operation is simply performed on the first block BLKi. As the read operation for the first block BLKi is repeated, the read count value RC1 increases. The foregoing process illustrates step S110 of FIG. 7.

Figure 8B:
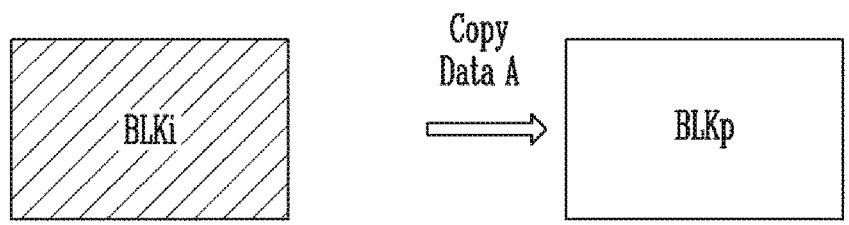
Figure 8C:
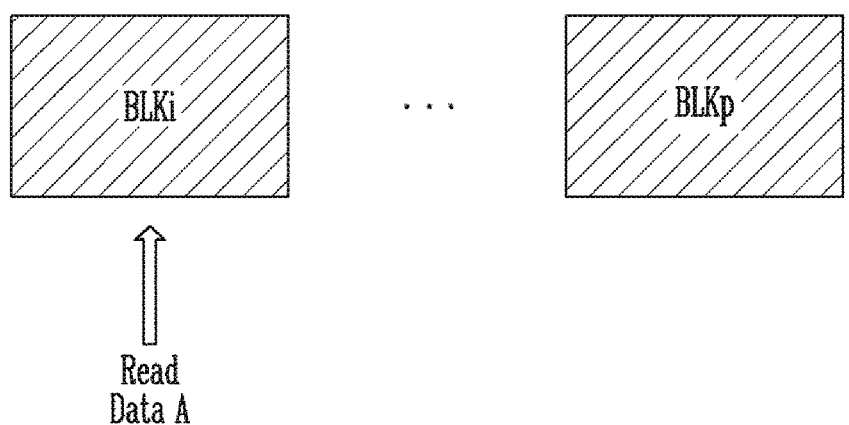

As illustrated in FIG. 8B, when the read count value RC1 reaches the copy generation reference value CRV, the original data Data A stored in the first block BLKi is copied in the second block BLKp. Accordingly, the first block BLKi is an original memory block, and the second memory block BLKp is a copy memory block. The foregoing process illustrates step S112 of FIG. 7. Then, as illustrated in FIG. 8C, when a read request for the original data Data A is made while the read count value RC1 is smaller than the predetermined first reference value RV1, the read operation is performed on the first block BLki. As the read operation for the first block BLKi is repeated, the read count value RC1 increases. In this case, the read operation of the original data Data A is performed on the first block BLKi, and a copy data of the data Data A is stored in the second block BLKp.

Figure 8D:
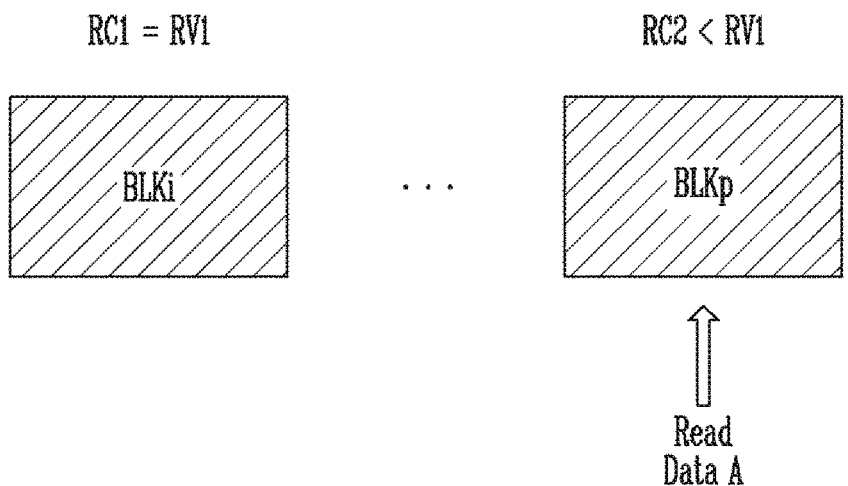

Then, as illustrated in FIG. 8D, when the read count value RC1 reaches the first reference value RV1, the read operation is performed on the second block BLKp when a read request for the original data Data A is made. Herein, the copy generation reference value CRV is a value smaller than the first reference value RV1. Accordingly, according to the increase in the read count value RC1, the read count value RC1 first reaches the copy generation reference value CRV, so that the copy data Data A is stored in the second block BLKp, and then the read count value RC1 reaches the first reference value RV1, so that the read operation is performed on the second block BLKp. However, depending on an embodiment, the copy generation reference value CRV may be the same value as the first reference value RV1. In this case, the read count value RC1 of the first block BLKi reaches the copy generation reference value (CRV=RV1), so that the original data Data A is copied to the second block BLKp and the read operation is performed on the second block BLKp together. As described above, copy generation reference value CRV may be determined within the range that is the same as or smaller than the first reference value RV1.

The fact that the read count value RC1 reaches the first reference value RV1 may mean a state where lots of read stress is generated for the first block BLKi, and thus, a threshold voltage distribution of the memory cells within the first block BLKi may be similar to the threshold voltage distribution illustrated in FIG. 6B. Accordingly, in order to decrease a read error, the read operation is performed on the second block BLKp. To this end, the address information about the map table 235 illustrated in FIG. 1 is updated. That is, the address information about the map table 235 is updated so that the access to the data Data A is made through the second block BLKp, not through the first block BLKi. The foregoing process is illustrated in step S114 of FIG. 7.

Figure 8E:
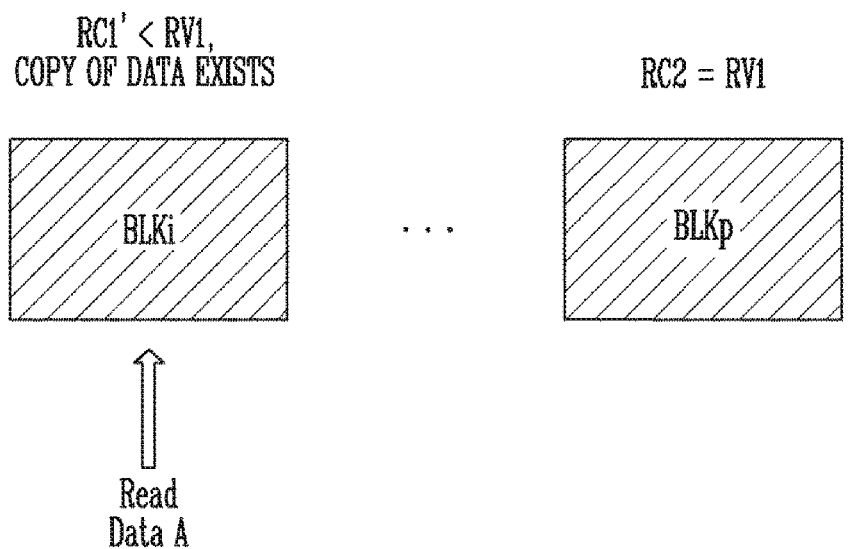

Then, as illustrated in FIG. 8E, when a read count value RC2 of the second block BLKp reaches the first reference value RV1, the read operation is performed on the first block BLKp again when a read request for the data Data A is made. Since the read operation is not performed on the first block BLKi while the read count value RC2 of the second block reaches the first reference value RV1, the threshold voltage distribution may be slightly shifted in a down direction as illustrated in FIG. 6C. Therefore, when the read operation for the second block BLKp is performed several times and the threshold voltage distribution of the memory cells of the second block BLKp is changed, the read operation is performed on the first block BLKi again, thereby decreasing a read error caused by the read stress. The foregoing process is illustrated in step S116 of FIG. 7.

When the read operation is performed on the first block BLKi again, the read count value RC1 of the first block BLKi may be initialized. Accordingly, the read operation is performed on the first block BLki while an initialized read count value RC1' is smaller than the first reference value RV1. In this case, the read count value RC1' may be initialized to 0, and may also be initialized to a larger value than 0 as necessary. When the threshold voltage for the first block BLKi is not sufficiently returned while the read operation is performed on the second block BLKp, the read count value RC1' may be initialized to a larger value than 0. In this case, the map table may be updated so that the read operation is performed on the second block RC2 again by the smaller number of times of the read operation than that of the initial case.

Figure 9A:
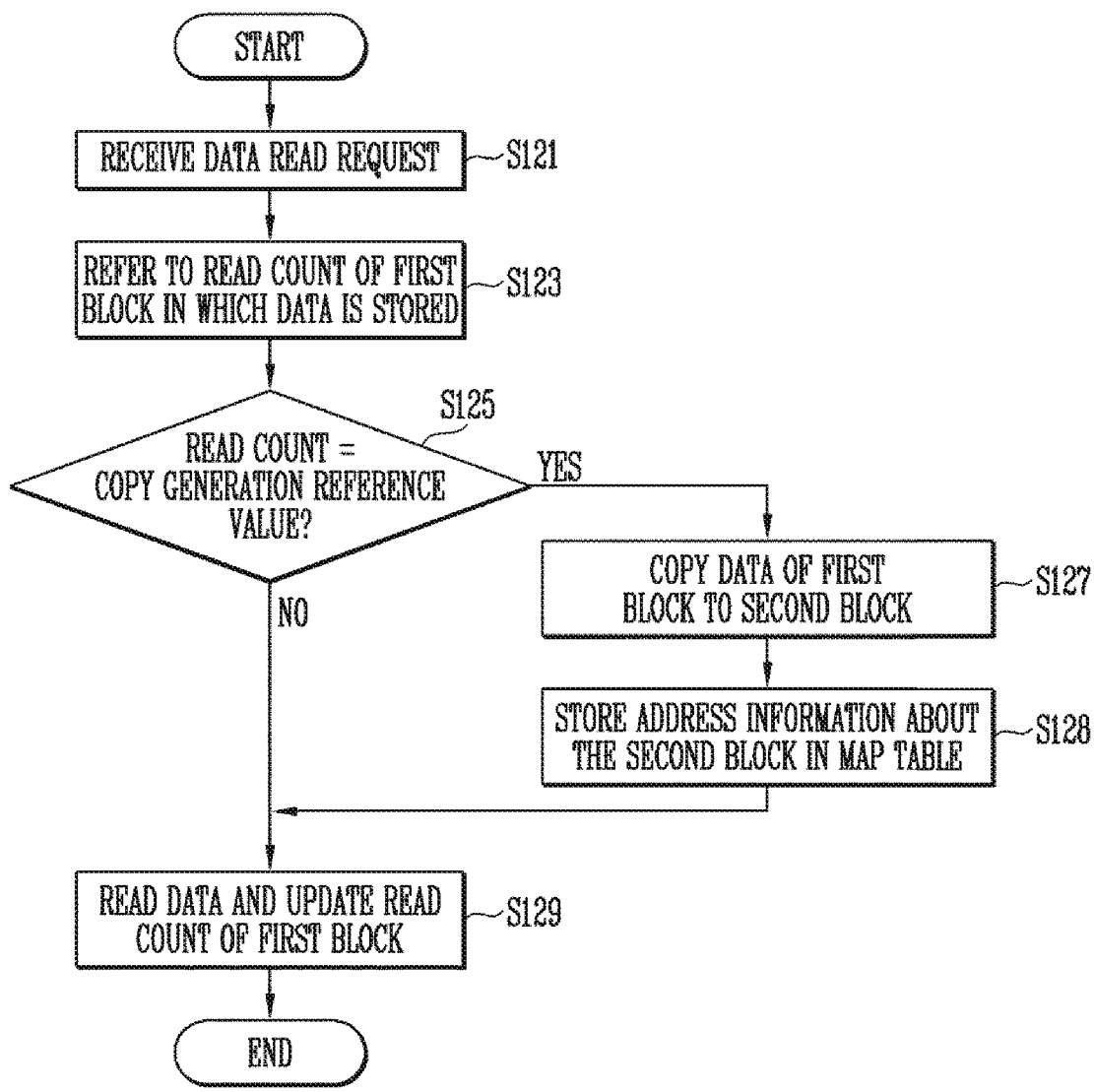
FIG. 9A is a flowchart illustrating an operating method of the controller according to the exemplary embodiment of the present disclosure.

FIG. 9A is a flowchart illustrating an operating method of the controller 200 according to the exemplary embodiment of the present disclosure. The flowchart of FIG. 9A represents an operating method of the controller 200 in a different aspect from that of the flowchart of FIG. 7.

Referring to FIG. 9A, at step S121, the controller 200 receives a data read request from a host. At step S123, the read count comparing unit 211 of the controller 200 refers to the read count value RC1 of the first block BLKi stored in the read count storage unit 231. At step S125, the read count comparing unit 211 of the controller 200 compares the read count value RC1 with the copy generation reference value CRV. At step S129, when the read count value RC1 is smaller than the copy generation reference value CRV (that is, "NO" at step S125), the controller 200 reads the original data Data A of the first block BLKi, and updates the read count value RC1. The update may be an operation of increasing the read count value RC1 by 1. The foregoing process may be the process illustrated in FIG. 8A.

On the other hand, when the read count value RC1 reaches the copy generation reference value CRV (that is, "YES" at step S125), the controller 200 copies the original data Data A of the first block BLKi to the second block BLKp at step S127. Then, at step S128, address information about the second block BLKp, in which the copied data Data A is stored, is stored in the map table 235. In this case, the address information about the second block BLKp may be stored by the scheme represented in Table 1 above. In this case, the address information about the first block BLKi that is an original memory block may be stored as ADDR_PO, and the address information about the second block BLKp that is a copy memory block may be stored as ADDR_PC. Steps S127 and S128 may be the processes illustrated in FIG. 8B. That is, FIG. 9A illustrates the processes illustrated in FIGS. 8A and 8B. Subsequent processes will be described below with reference to FIG. 9B.

Figure 9B:
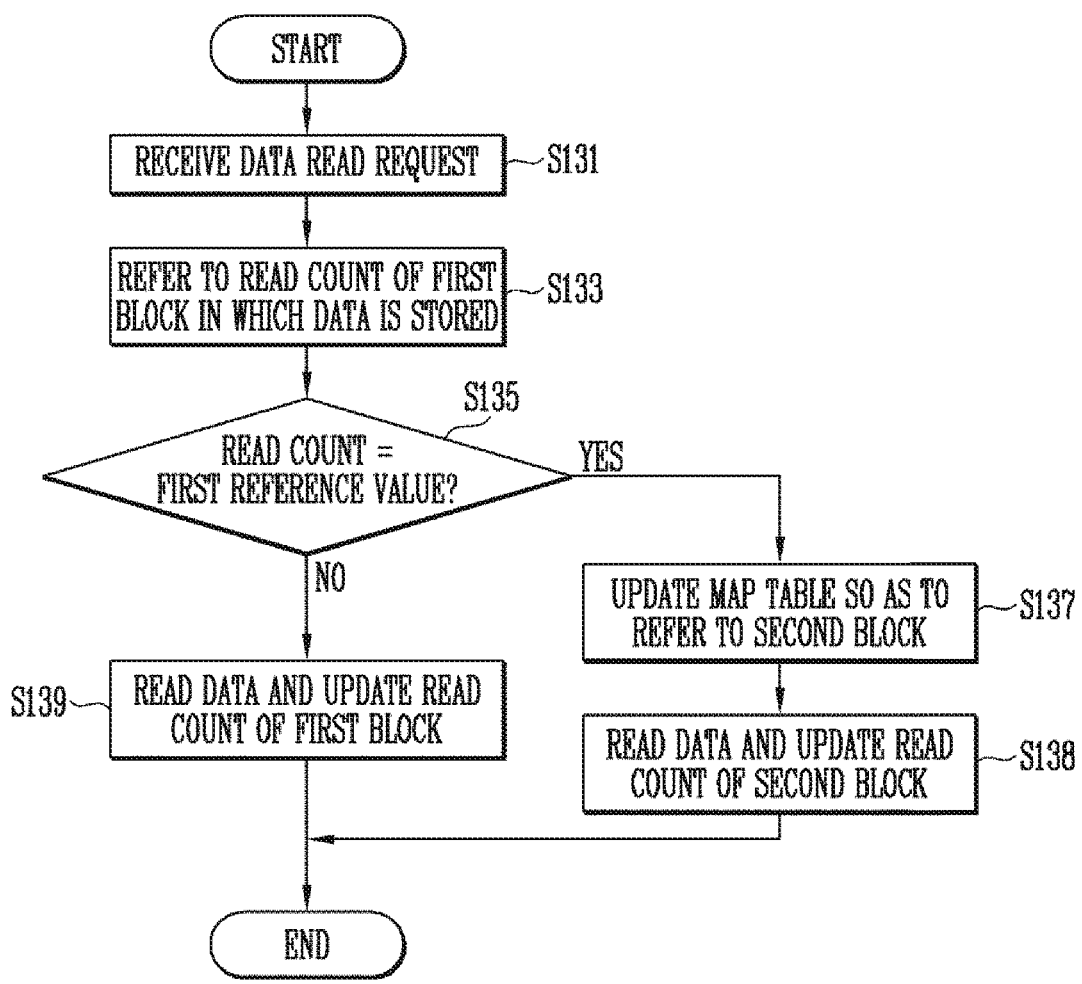
FIG. 9B is a flowchart illustrating an operating method of the controller according to the exemplary embodiment of the present disclosure.

FIG. 9B is a flowchart illustrating an operating method of the controller 200 according to the exemplary embodiment of the present disclosure. The flowchart of FIG. 9B represents an operating method of the controller 200 in a different aspect from that of the flowchart of FIG. 7.

FIG. 9B is a flowchart illustrating a method performed in the state where copy data is stored in the second block BLKp. Referring to FIG. 9B, at step S131, the controller 200 receives a data read request from a host. At step S133, the read count comparing unit 211 of the controller 200 refers to the read count value RC1 of the first block BLKi stored in the read count storage unit 231. At step S135, the read count comparing unit 211 of the controller 200 compares the read count value RC1 with the first reference value RV1. When the read count value RC1 is smaller than the first reference value RV1 (that is, "NO" at step S139), the controller 200 reads the original data Data A of the first block BLKi, and updates the read count value RC1 at step S139. The update may be an operation of increasing the read count value RC1 by 1. The foregoing process may be the process illustrated in FIG. 8C. On the other hand, when the read count value RC1 reaches the first reference value RV1 (that is, "YES" at step S135), the controller 200 updates the map table 235 so as to refer to the second block BLKp at step S137. Then, at step S138, the controller 200 performs the read operation of the copy data Data A on the second block BLKp, and updates the read count value RC2 of the second block BLKp. Steps S137 and S138 may be the processes illustrated in FIG. 8D.

That is, FIG. 9B illustrates the processes illustrated in FIGS. 8C and 8D. Subsequent processes will be described below with reference to FIG. 9C.

Figure 9C:
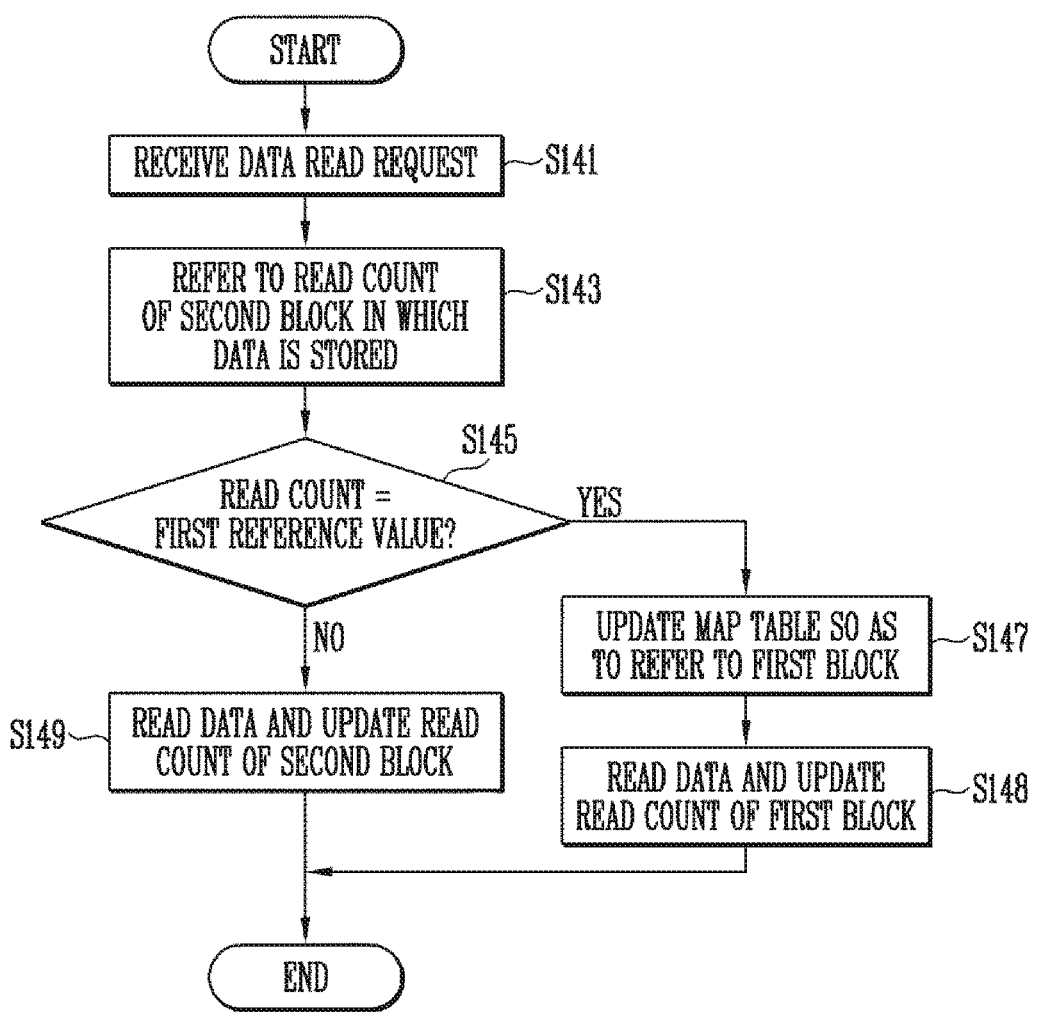
FIG. 9C is a flowchart illustrating an operating method of the controller according to the exemplary embodiment of the present disclosure.

FIG. 9C is a flowchart illustrating an operating method of the controller 200 according to the exemplary embodiment of the present disclosure. The flowchart of FIG. 9C represents an operating method of the controller 200 in a different aspect from that of the flowchart of FIG. 7.

Referring to FIG. 9C, at step S141, the controller 200 receives a data read request from a host. At step S143, the read count comparing unit 211 of the controller 200 refers to the read count value RC2 of the second block BLKp stored in the read count storage unit 231. At step S145, the read count comparing unit 211 of the controller 200 compares the read count value RC2 with the first reference value RV1. When the read count value RC2 is smaller than the first reference value RV1 (that is, "NO" at step S145), the controller 200 reads the copy data Data A of the second block BLKp, and updates the read count value RC2 at step S149. The update may be an operation of increasing the read count value RC2 by 1. The foregoing process may be the process illustrated in FIG. 8D.

On the other hand, when the read count value RC2 reaches the first reference value RV1 (that is, "YES" at step S145), the controller 200 updates the map table 235 so as to refer to the first block BLKi at step S147. At step S148, the controller 200 performs the read operation of the original data Data A on the first block BLKi, and updates the initialized read count value RC1' of the first block BLKi. Steps S147 and S148 may be the processes illustrated in FIG. 8E. That is, FIG. 9C illustrates the processes illustrated in FIGS. 8D and 8E.

Figure 10:
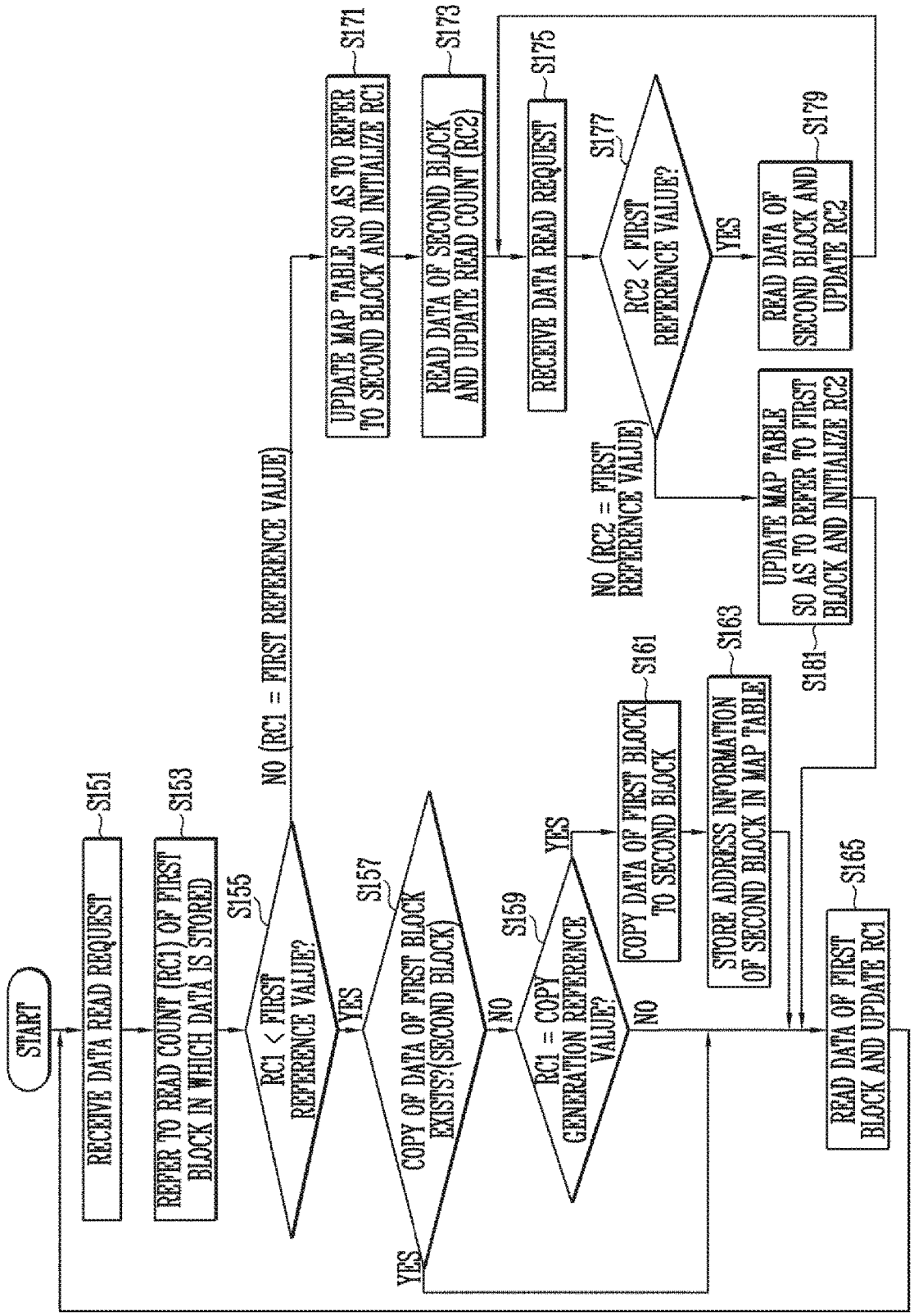
FIG. 10 is a flowchart illustrating an operating method of the controller according to the exemplary embodiment of the present disclosure.

FIG. 10 is a flowchart illustrating an operating method of the controller 200 according to the exemplary embodiment of the present disclosure. Specifically, FIG. 10 is a flowchart in which the methods of FIGS. 9A to 9C are combined.

Referring to FIG. 10, at step S151, the controller 200 receives a data read request from a host. At step S153, the read count comparing unit 211 refers to the read count value RC1 of the first block, in which the original data Data A is stored. Then, at step S155, it is determined whether the read count value RC1 is smaller than the first reference value RV1. When the read count value RC1 is smaller than the first reference value RV1 (that is, "YES" at step S155), it is determined whether a copy of the data Data A exists at step S157. When the copy of the original data Data A does not exist (that is, "NO" at step S157), it is determined whether the read count value RC1 is equal to the copy generation reference value CRV at step S159. When the read count value RC1 is different from the copy generation reference value CRV (that is, "NO" at step S159), the controller 200 reads the original data Data A of the first block BLKi, and updates the read count value RC1 at step S165. The foregoing process corresponds to step S110 of FIG. 7, as well as FIG. 8A.

When the read count value RC1 reaches the copy generation reference value CRV (that is, "YES" at step S159), the controller 200 copies the original data Data A of the first block BLKi to the second block BLKp at step S161. Further, at step S163, the address information about the second block BLKp is stored in the map table 235. The foregoing process corresponds to step S112 of FIG. 7, as well as FIG. 8B.

When the copy of the data Data A of the first block BLKi exists (that is, "YES" at step S157), it is not necessary to determine whether the read count value RC1 is equal to the copy generation reference value CRV, meaning that the controller 200 directly performs step S165 to read the original data Data A of the first block BLKi and updates the read count value RC1. The foregoing process corresponds to FIG. 8C.

When step S165 is completed, the read operation of the data Data A is completed, so that step S151 of receiving a next read request is performed.

When the read count value RC1 reaches the first reference value RV1 (that is, "NO" at step S155), the controller 200 updates the map table 235 so as to refer to the second block BLKp, and initializes the read count value RC1 of the first block BLKi at step S171. Then, the controller 200 reads the copy data Data A of the second block BLKp, and updates the read count value RC2 of the second block BLKp at step S173. The foregoing process corresponds to step S114 of FIG. 7, as well as FIG. 8D.

Then, the controller 200 may receive a read request for the data Data A from the host again at step S175. In this case, it is determined whether the read count value RC2 is smaller than the first reference value RV1 at step S177. When the read count value RC2 is smaller than the first reference value RV1 (that is, "YES" at step S177), the controller 200 reads the copy data Data A of the second block BLKp, and updates the read count value RC2 at step S179.

When the read count value RC2 reaches the first reference value RV1 (that is, "NO" at step S177), the controller 200 updates the map table 235 so as to refer to the first block BLKi, and initializes the read count value RC2 of the second block BLKp at step S181. Then, the controller 200 may read the original data Data A of the first block BLKi based on the update of the map table 235, and update the initialized read count value RC1 of the first block at step S165. The foregoing process corresponds to step S116 of FIG. 7, as well as FIG. 8E.

FIG. 11 is a flowchart illustrating an operating method of the controller 200 according to another exemplary embodiment of the present disclosure. FIGS. 12A to 12E are diagrams for describing the operating method according to FIG. 11.

Referring to FIG. 11, at step S210, the controller 200 controls the semiconductor memory device 100 so as to read the original data of the first block, and the read count value of the first block is updated. Then, at step S212, when the read count value of the first block reaches the predetermined copy generation reference value, the controller 200 controls the semiconductor memory device 100 so as to copy the original data of the first block to the second block. Then, at step S214, when the read count value of the first block reaches the predetermined first reference value, the controller 200 controls the semiconductor memory device 100 so as to read the copy data of the second block. Then, at step S216, when the read count value of the second block reaches the second reference value that is different from the first reference value, the controller 200 controls the semiconductor memory device 100 so as to erase the second block and read the original data of the first block again. Hereinafter, the operating method illustrated in FIG. 11 will be described in detail with reference to FIGS. 12A to 12E.

Referring to FIG. 12A to 12E, FIGS. 12A to 12D are the same as FIGS. 8A to 8D. Accordingly, overlapping descriptions will be omitted.

Figure 12A:
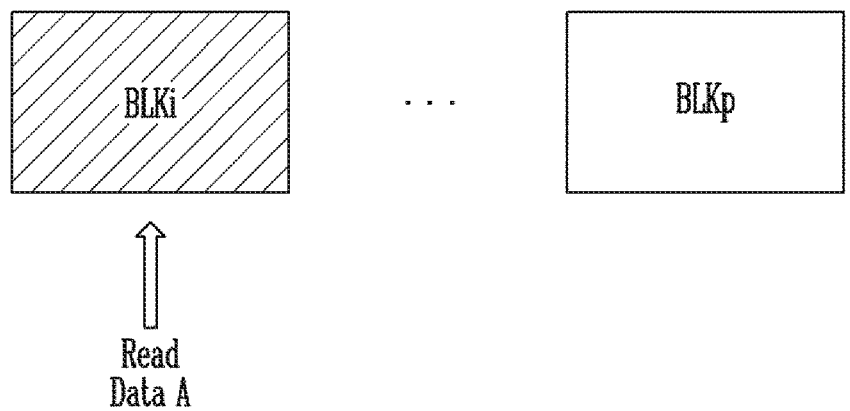
FIGS. 12A to 12E are diagrams for describing the operating method according to FIG. 11.

Referring to FIG. 12A, the original data Data A is stored in the first block BLKi. The read operation is performed on the first block BLKi while the read count value RC1 for the first block BLKi is smaller than the copy generation reference value CRV. The foregoing process illustrates step S210 of FIG. 11.

Figure 12B:
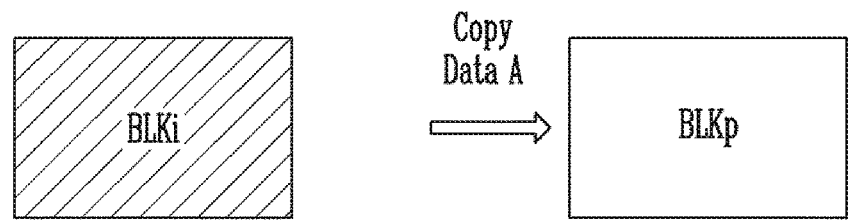
Figure 12C:
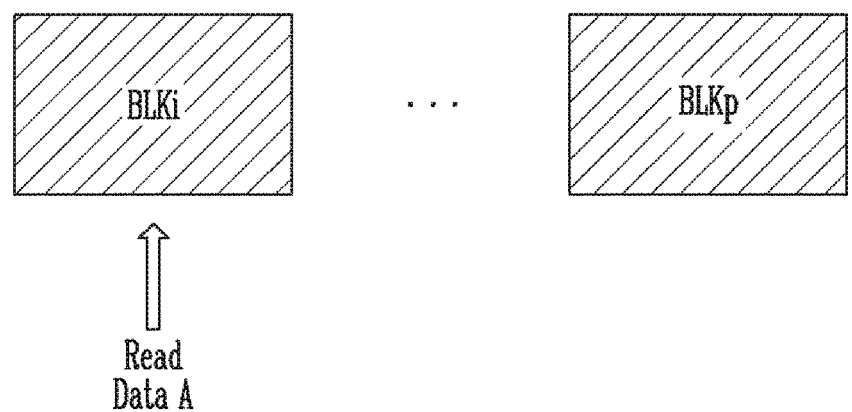

As illustrated in FIG. 12B, when the read count value RC1 reaches the copy generation reference value CRV, the original data Data A stored in the first block BLKi is copied to the second block BLKp. This process illustrates step S212 of FIG. 11. Then, as illustrated in FIG. 12C, when a read request for the data Data A is made while the read count value RC1 is smaller than the predetermined first reference value RV1, the read operation is performed on the first block BLki.

Figure 12D:
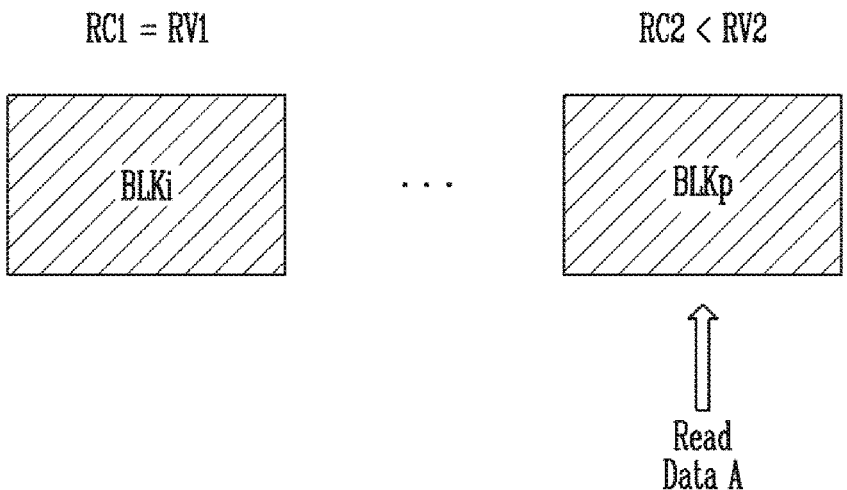

Then, as illustrated in FIG. 12D, when the read count value RC1 reaches the first reference value RV1, the read operation is performed on the second block BLKp when a read request for the data Data A is made. As described above, the copy generation reference value CRV may be determined within the range that is the same as or smaller than the first reference value RV1. This process illustrates step S214 of FIG. 11.

Figure 12E:
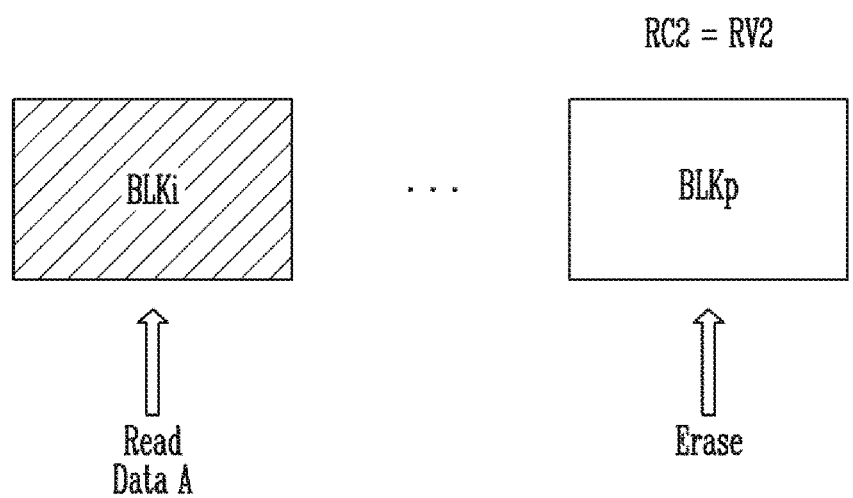

Then, as illustrated in FIG. 12E, when the read count value RC2 of the second block BLKp reaches the second reference value RV2, the read operation is performed on the first block BLkp again when a read request for the data Data A is made. This process illustrates step S216 of FIG. 11.

The second reference value RV2 is the value different from the first reference value RV1. Particularly, the second reference value RV2 is the value larger than the first reference value RV1. As an example, the second reference value RV2 may be a value representing a read stress to a point where data read method, such as read-retry, cannot be used. More specifically, the second reference value RV2 may be a value indicating a read stress so severe that an error of the data within the memory block cannot be corrected even if an Error Correcting Code (ECC) is used. The second reference value RV2 may be experimentally determined. For example, the second reference value RV2 may be determined by performing the read operation on the memory block several times, and statistically calculating a read count value at a point, at which read stress is generated, so that an error is not corrected through an ECC. When the read count value of the memory block is repeated up to the second reference value RV2, the read operation cannot be performed on the corresponding memory block even with a scheme, such as read-retry. Accordingly, according to the operating method of the controller according to the exemplary embodiment of the present disclosure, when the read count value RC2 of the second block BLKp, in which the copy of the data Data A is stored, reaches the second reference value RV2, the second block BLKp is no longer used and is erased. In another exemplary embodiment, instead of determining the second reference value RV2 in advance and comparing the second reference value RV2 with the read count value, when the copy data of the second block BLKp is read and an error correction is performed through the ECC, but the correction of the error has failed, the second block BLKp is no longer used and is erased. In this case, it is not necessary to determine the second reference value RV2 in advance. When the error correction fails, the second block BLKp is erased and the read operation is performed on the first block BLKi. In this case, step S216 may be substituted as the operation of "erasing the second block and reading the original data of the first block when the error correction for the second block is failed."

The foregoing process is illustrated in FIG. 12E. On the other hand, in the exemplary embodiment described with reference to FIGS. 7 to 10, the read operation is performed only until the read count value of the second block BLKp reaches the first reference value RV1. Thus, there is a difference in that the read operation is performed again using the second block BLKp without erasing the second block BLKp.

Figure 13:
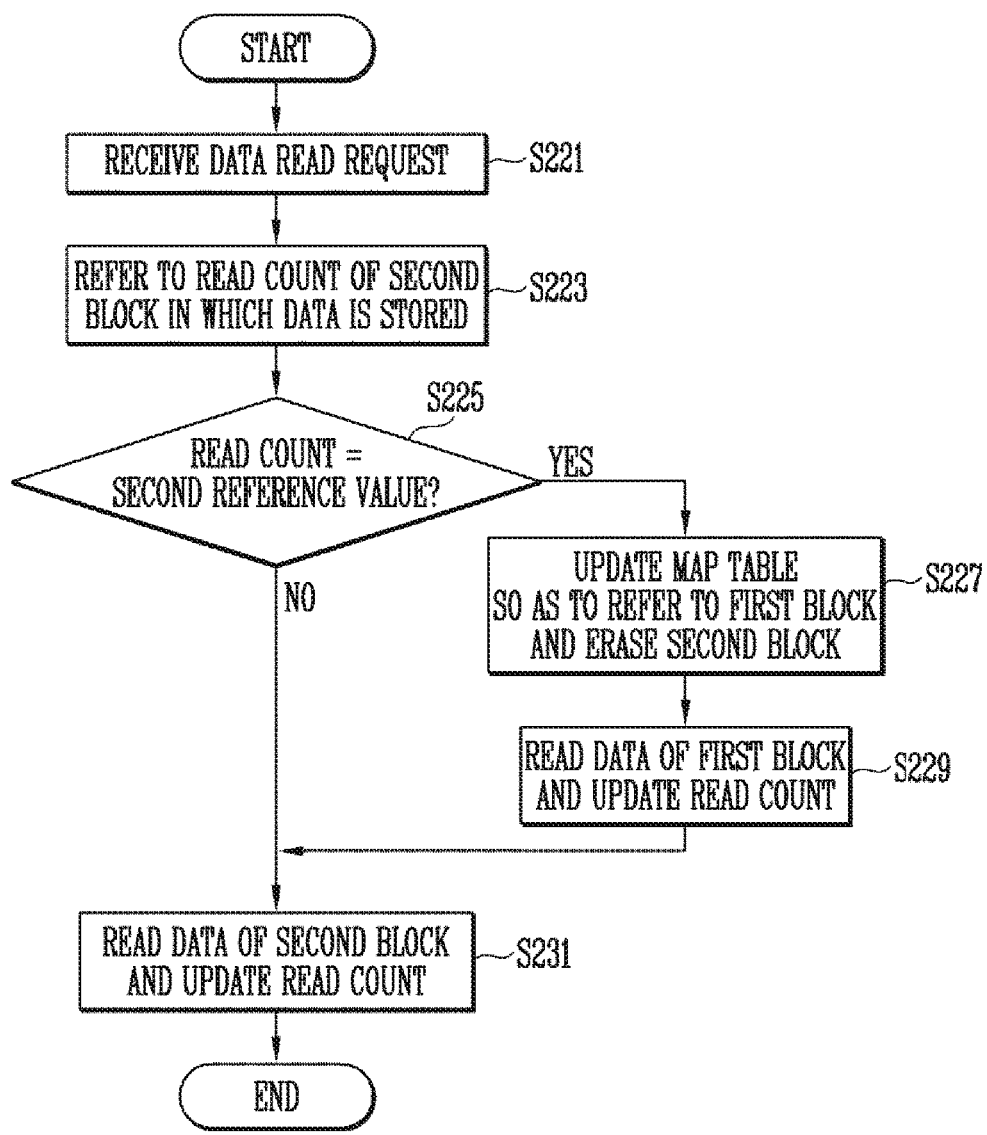
FIG. 13 is a flowchart illustrating the operating method of the controller according to the exemplary embodiment of the present disclosure.

FIG. 13 is a flowchart illustrating the operating method of the controller 200 according to the exemplary embodiment of the present disclosure. The flowchart of FIG. 13 represents an operating method of the controller 200 in a different aspect from that of the flowchart of FIG. 11. More particularly, the flowchart of FIG. 13 is a flowchart representing the processes illustrated in FIGS. 12D and 12E. The processes illustrated in FIGS. 12A to 12C substantially correspond to the flowcharts illustrated in FIGS. 9A and 9B, so that the overlapping illustrations are omitted.

Referring to FIG. 13, at step S221, the controller 200 receives a data read request from a host. Then, at step S223, the read count comparing unit 211 of the controller 200 refers to the read count value RC2 of the second block BLKp stored in the read count storage unit 231. Further, at step S225, the read count comparing unit 211 of the controller 200 compares the read count value RC2 with the second reference value RV2. The second reference value RV2 is a value different from the first reference value RV1, and is generally a larger value than the first reference value RV1. When the read count value RC2 is smaller than the second reference value RV2 (that is, "NO" at step S225), the controller 200 reads the copy data Data A of the second block BLKp, and updates the read count value RC2 at step S231. The update may be an operation of increasing the read count value RC2 by 1. The foregoing process may be the process illustrated in FIG. 12D.

On the other hand, when the read count value RC2 reaches the second reference value RV2 as a result of the comparison (that is, "YES" at step S225), the controller 200 updates the map table 235 so as to refer to the first block BLKi and erases the second block BLKp at step S227. Optionally, the controller 200 may invalidate the second block BLKp instead of erasing the second block at step S227. In this case, the substantial erase operation of the second block BLKp may be performed whenever the data is programmed in the second block BLKp later. Then, at step S229, the controller 200 performs the read operation of the original data Data A on the first block BLKi, and updates the initialized read count value RC1' of the first block BLKi. Steps S227 and S229 may be the processes illustrated in FIG. 12E. That is, FIG. 13 illustrates the processes illustrated in FIGS. 12D and 12E.

As described above, instead of determining whether the read count value reaches the second reference value by referring to the read count value of the second block at steps S223 and S225, those steps can be replaced by a step that reads, "determine whether a failure of an error correction for the second memory block is generated." If the error correction has not failed, then S231 may be performed. If the error correction has failed, steps S227 and S229 may be performed.

Figure 14:
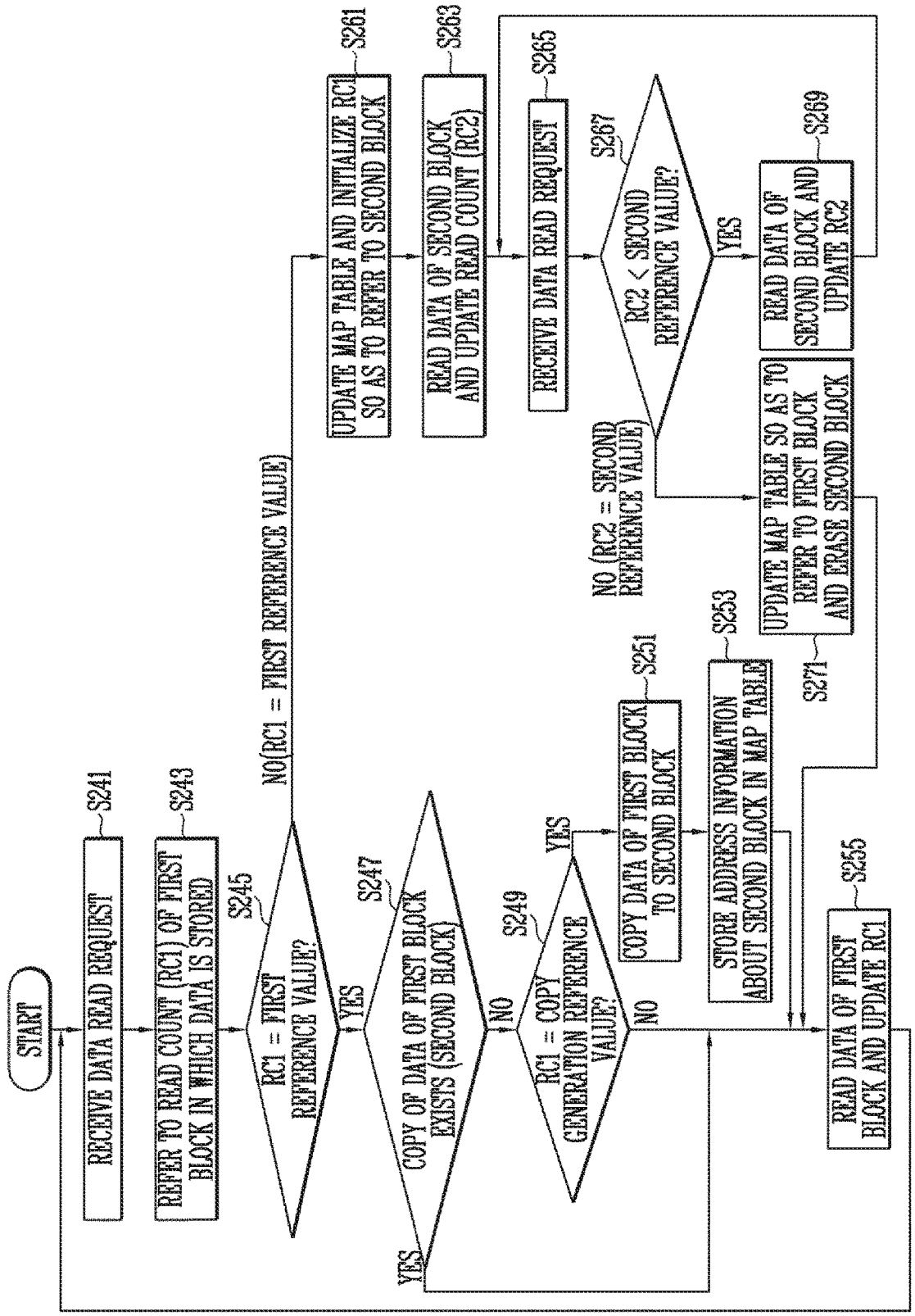
FIG. 14 is a flowchart illustrating the operating method of the controller according to the exemplary embodiment of the present disclosure.

FIG. 14 is a flowchart illustrating the operating method of the controller 200 according to the exemplary embodiment of the present disclosure. More particularly, FIG. 14 is a particular flowchart describing the operations illustrated in FIGS. 12A to 12E.

Referring to FIG. 14, steps S241, S243, S245, S247, S249, S251, S253, S255, S261, S263, and S265 are substantially the same to steps S151, S153, S155, S157, S159, S161, S163, S165, S171, S173, and S175 illustrated in FIG. 10. Accordingly, repetitive descriptions of the corresponding operation will be omitted.

At step S267 of FIG. 14, the controller 200 determines whether the read count value RC2 is smaller than the second reference value RV2 in response to a data read request from a host at step S267. When the read count value RC2 is smaller than the second reference value RV2 (that is, "YES" at step S267), the controller 200 reads the copy data Data A of the second block BLKp, and updates the read count value RC2 at step S269. When the read count value RC2 reaches the second reference value RV2 (that is "NO" at step S267), the controller 200 updates the map table 235 so as to refer to the first block BLKi and erases the second block BLKp at step S271. Then, the controller 200 may read the original data Data A of the first block BLKi based on the update of the map table 235, and update the initialized read count value RC1 of the first block at step S255. The foregoing process corresponds to step S216 of FIG. 11, as well as FIG. 12E.

In another exemplary embodiment, instead of comparing the read count value RC2 with the second reference value RV2 at step S267, it may also be determined whether an error correction of the second block BLKp has failed. When the error correction of the second block BLKp has not failed, step S269 is performed to read the copy data of the second block. When the error correction of the second block BLKp has failed, step S271 is performed to update the map table so as to refer to the first block BLKi and erase the second block BLKp.

Figure 15:
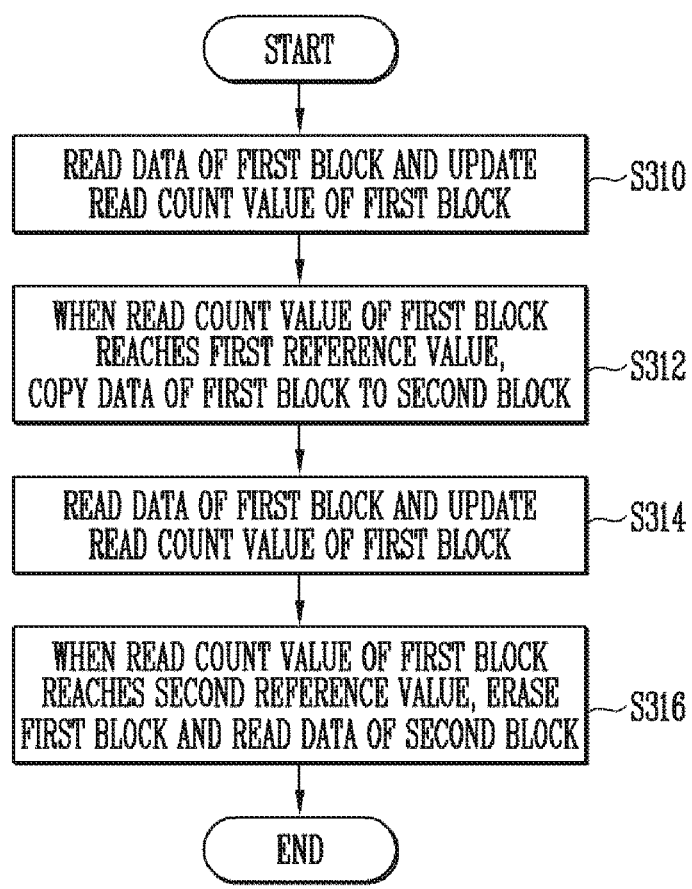
FIG. 15 is a flowchart illustrating the operating method of the controller according to another exemplary embodiment of the present disclosure.

FIG. 15 is a flowchart illustrating the operating method of the controller 200 according to another exemplary embodiment of the present disclosure. FIGS. 16A to 16D are diagrams for describing the operating method according to FIG. 15.

Referring to FIG. 15, at step S310, the controller 200 controls the semiconductor memory device 100 so as to read data of the first block, and updates the read count value of the first block. Then, at step S312, when the read count value of the first block reaches the predetermined first reference value RV1, the controller 200 controls the semiconductor memory device 100 so as to copy the data of the first block to the second block. Then, the controller 200 controls the semiconductor memory device 100 to read the original data of the first block, and updates the read count value of the first block at step S314. Then, when the read count value of the first block reaches the predetermined second reference value RV2, the controller 200 controls the semiconductor memory device 100 to erase the first block and read the copy data of the second block at step S316. Hereinafter, the operating method illustrated in FIG. 15 will be described in detail with reference to FIGS. 16A to 16D.

Figure 16A:
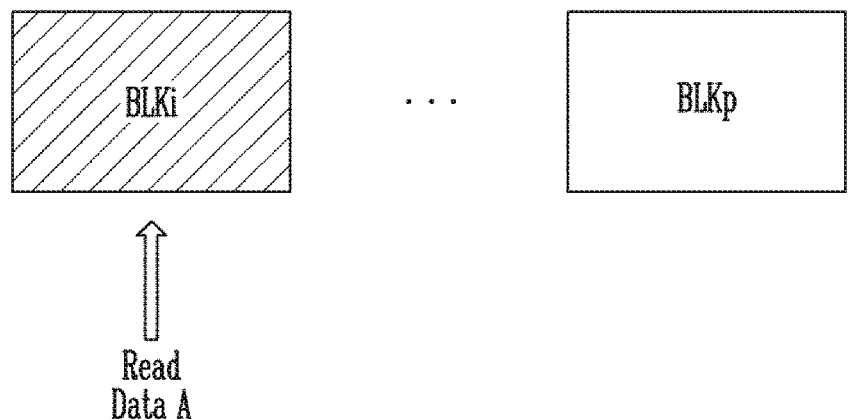
FIGS. 16A to 16D are diagrams for describing the operating method according to FIG. 15.

Referring to FIG. 16A, the original data Data A is stored in the first block BLKi. When a read request for the data Data A is made while the read count value RC1 for the first block BLKi is smaller than the first reference value RV1, the read operation is simply performed on the first block BLKi. As the read operation for the first block BLKi is repeated, the read count value RC1 increases. The foregoing process is performed at step S310. In comparison with the previous exemplary embodiment, in the exemplary embodiment related to FIGS. 15 and 16A, the first reference value RV1 may serve the same function as that of the copy generation reference value CRV.

Figure 16B:
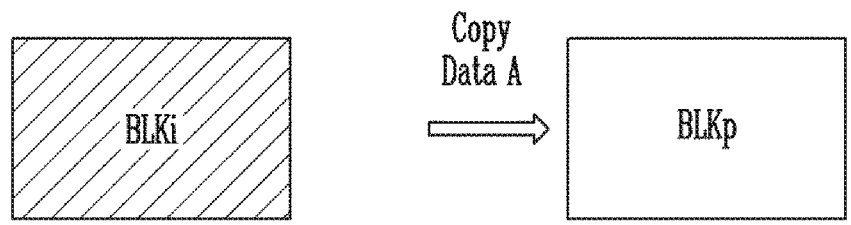
Figure 16C:
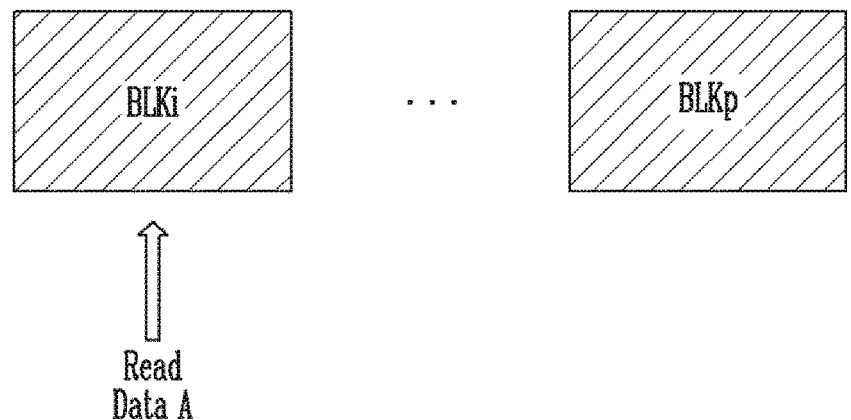

As illustrated in FIG. 16B, when the read count value RC1 reaches the first reference value RV1, the original data Data A stored in the first block BLKi is copied in the second block BLKp. The foregoing process illustrates step S312 of FIG. 15. Then, as illustrated in FIG. 16C, when a read request for the data Data A is made while the read count value RC1 is smaller than the predetermined second reference value RV2, the read operation is performed on the first block BLKi. As the read operation for the first block BLKi is repeated, the read count value RC1 increases. In this case, the read operation of the original data Data A is performed on the first block BLKi, and a copy of the data Data A is in a state of being stored in the second block BLKp. This process illustrates step S314 of FIG. 15.

Figure 16D:
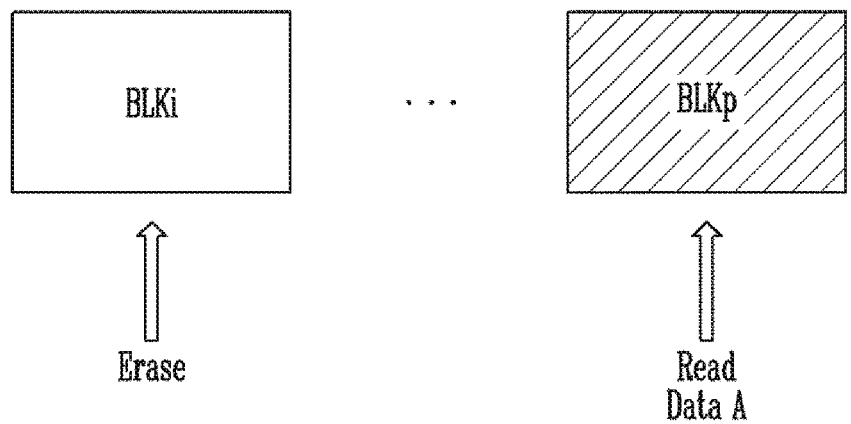

Then, as illustrated in FIG. 16D, when the read count value RC1 reaches the second reference value RV2, the first block BLKi is erased and the read operation is performed on the second block BLKp when a read request for the data Data A is made later. As described above, the second reference value RV2 is the value different from the first reference value RV1. Specifically, the second reference value RV2 is the value larger than the first reference value RV1. As an example, the second reference value RV2 may be a value representing a read stress to a point where data read method, such as read-retry, cannot be used. The second reference value RV2 may be experimentally determined. The foregoing process illustrates step S316 of FIG. 15.

The method described with reference to FIGS. 15, and 16A to 16D is different from the methods described with reference to FIGS. 7 to 15 in that the first memory block may be erased. That is, when the read operation of the data is performed on the copy memory block, the original memory block is erased. Optionally, the original memory block may also be invalidated.

Figure 17:
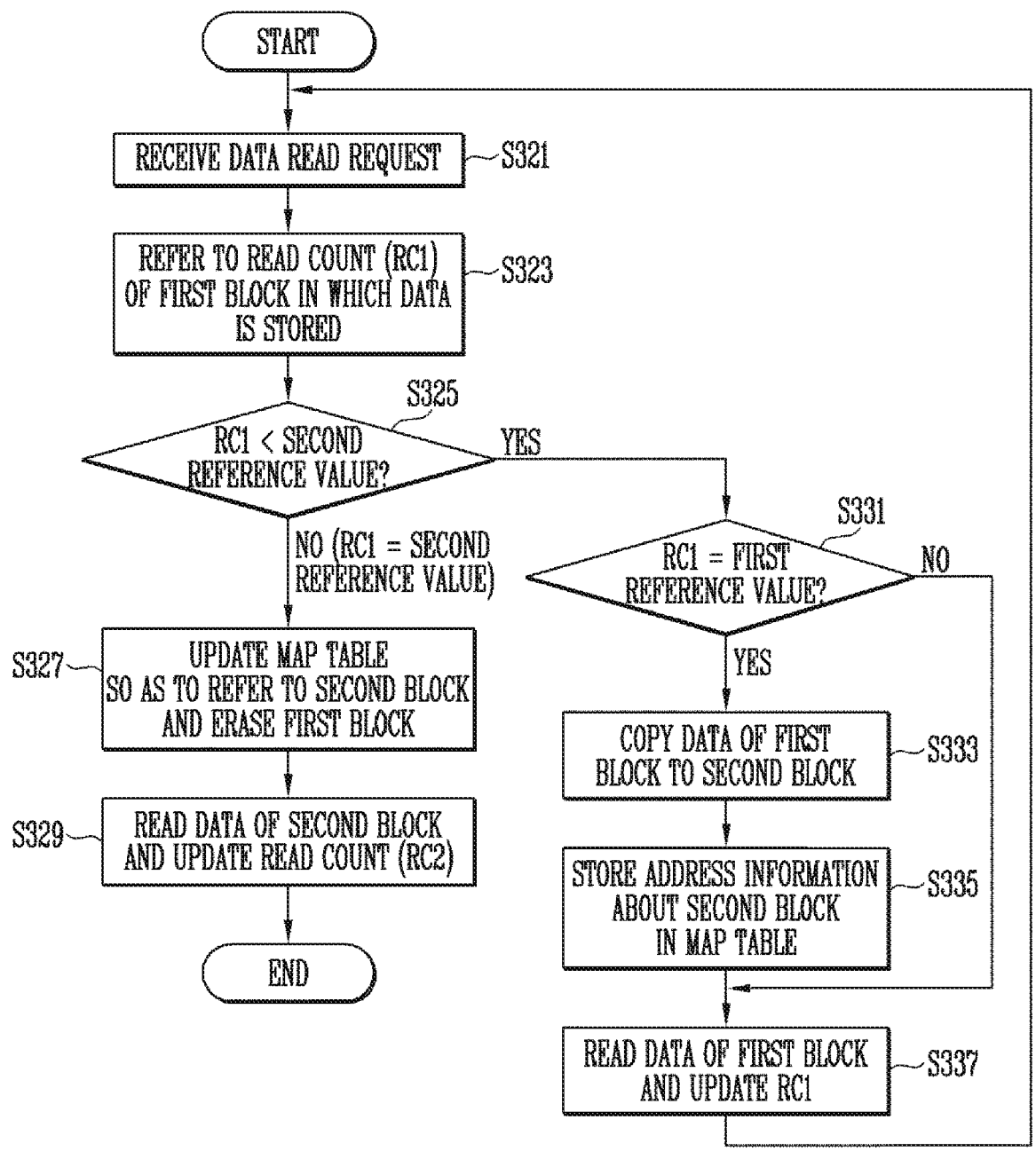
FIG. 17 is a flowchart illustrating an operating method of the controller according to yet another exemplary embodiment of the present disclosure.

FIG. 17 is a flowchart illustrating an operating method of the controller 200 according to another exemplary embodiment of the present disclosure. That is, FIG. 17 is a flowchart describing the method illustrated in FIG. 15 in more detail.

Referring to FIG. 17, at step S321, a data read request is received. At step S323, the read count comparing unit 211 of the controller 200 refers to the read count value RC1 of the first block BLKi stored in the read count storage unit 231.

At step S325, it is determined whether the read count value RC1 is smaller than the second reference value RV2. When the read count value RC1 is smaller than the second reference value RV2 (that is, "YES" at step S325), it is determined whether the read count value RC1 is smaller than the first reference value RV1 at step S331. When the read count value RC1 is smaller than the first reference value RV1 (that is, "NO" at step S331), the controller 200 reads the original data Data A of the first block BLKi, and updates the read count value RC1 at step S337. When the read count value RC1 reaches the first reference value RV1 (that is, "YES" at step S331), the original data of the first block is copied to the second block BLKp at step S333. Further, address information about the second block, in which the copy data is copied, is stored in the map table at step S335. Then, the original data of the first block is read, and the read count value RC1 is updated at step S337.

When the read count value RC1 reaches the second reference value RV2 (that is, "NO" at step S325), the map table is updated so as to the second block and the first block is erased at step S327. Then, at step S329, the copy data of the second block is read, and the read count value RC2 of the second block is updated. Then, when the read count value RC2 of the second block reaches the first reference value RV1, the copy data of the second block may be copied to another block. Further, when the read count value RC2 of the second block reaches the second reference value RV2, the second block is erased and the read operation is performed on the block, in which the copy data is copied.

Figure 18:
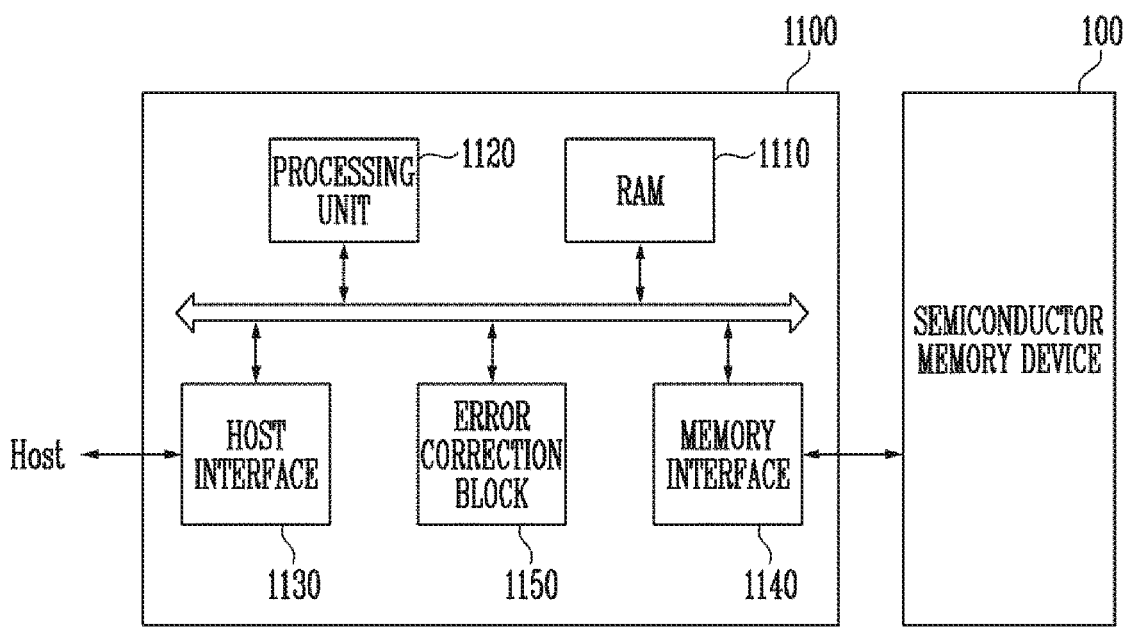
FIG. 18 is a block diagram illustrating the memory system of FIG. 1.

FIG. 18 is a block diagram illustrating the memory system of FIG. 1.

Referring to FIG. 18, a memory system 1000 may include a semiconductor memory device 100 and a controller 1100. The semiconductor memory device 100 and the controller 1100 may be the semiconductor memory device and the controller described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 may include a Random Access Memory (RAM) 1110, a processing unit 1120, a host interface 1130, a memory interface 1140, and an error correction block 1150. The RAM 1110 is used as at least one among a working memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host Host during the write operation.

The host interface 1130 may include a protocol for performing a data exchange between the host Host and the controller 1100. In an embodiment, the controller 1100 is configured to communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface may include a NAND interface or a NOR interface.

The error correction block 1150 is configured to detect and correct an error of data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. In an embodiment, the error correction block may be provided as a constituent element of the controller 1100.

The controller 1100 and the semiconductor memory device 100 may be integrated into one semiconductor device. As an exemplified embodiment, the controller 1100 and the semiconductor memory device 100 may be integrated into one semiconductor device to configure a memory card. For example, the controller 1100 and the nonvolatile memory device 100 may be integrated as one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) may include a storage device configured to store data in a semiconductor memory. In a case where the memory system 1000 is used as the SSD, a speed of the operation of the host Host connected to the memory system 1000 is remarkably improved.

For another example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

In an exemplary embodiment, the semiconductor memory device 100 or the memory system 1000 may be mounted in various types of package. For example, the semiconductor memory device 100 or the memory system 1000 may be packaged and embedded by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 19:
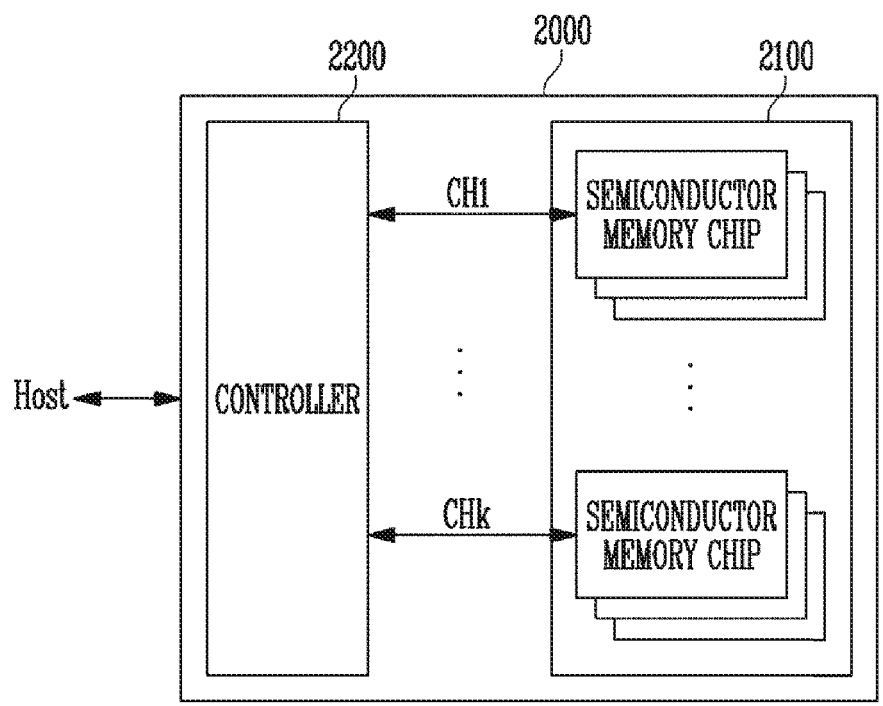
FIG. 19 is a block diagram illustrating an application example of the memory system of FIG. 18.

FIG. 19 is a block diagram illustrating an application example of the memory system of FIG. 18.

Referring to FIG. 19, a memory system 2000 may include a semiconductor memory device 2100 and a controller 2200. The semiconductor memory device 2100 may include a plurality of semiconductor memory chips. The plurality of semiconductor memory chips is divided into a plurality of groups.

In FIG. 19, it is illustrated that the plurality of groups communicates with the controller 2200 through first to $k^{th}$ channels CH1 to CHk, respectively. Each semiconductor memory chip may be configured and operated in a similar manner to that of one in the semiconductor memory device 100 described with reference to FIG. 1 or 2.

Each group is configured to communicate with the controller 2200 through one common channel. The controller 2200 is configured in a similar manner to that of the controller 1100 described with reference to FIG. 1 or 19, and is configured to control the plurality of memory chips of the semiconductor memory device 2100 through the plurality of channels CH1 to CHk.

Figure 20:
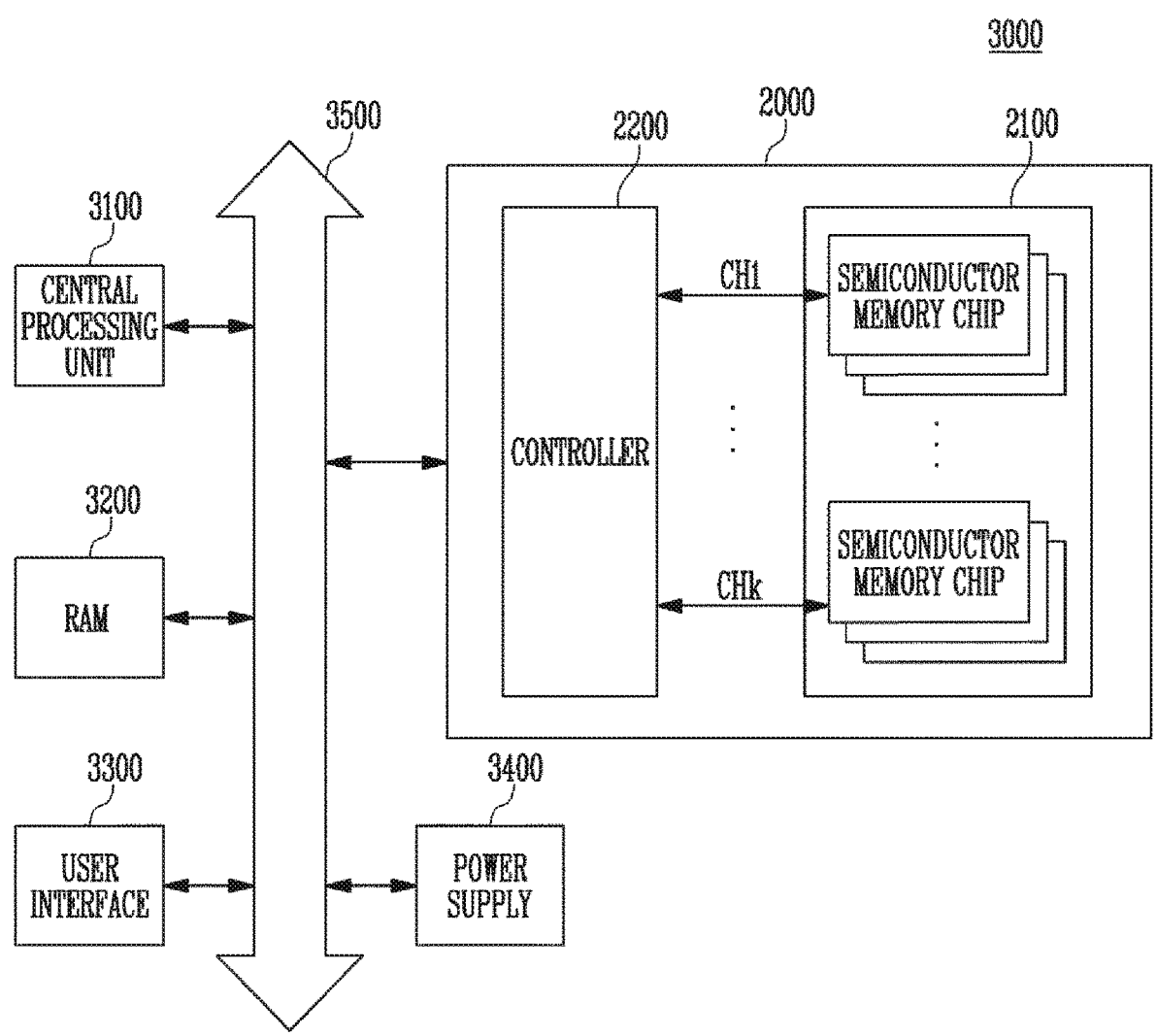
FIG. 20 is a block diagram illustrating a computing system including the memory system described with reference to FIG. 19.

FIG. 20 is a block diagram illustrating a computing system including the memory system described with reference to FIG. 19.

A computing system 3000 may include a central processing unit 3100, a Random Access Memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 20, it is illustrated that the semiconductor memory device 2100 is connected to the system bus 3500 through the controller 2200. However, the semiconductor memory device 2100 may be configured to be directly connected to the system bus 3500. In this case, a function of the controller 2200 may be performed by the central processing unit 3100 and the RAM 3200.

In FIG. 20, it is illustrated that the memory system 2000 described with reference to FIG. 19 is provided. However, the memory system 2000 may be substituted with the memory system 1000 described with reference to FIG. 18. As an exemplary embodiment, the computing system 3000 may be configured to include all of the memory systems 1000 and 2000 described with reference to FIGS. 18 and 19.

The exemplary embodiments of the present disclosure disclosed in the present specification and drawings simply suggest the specific examples for plainly explaining the contents of the technology of the present disclosure and helping the understanding of the present disclosure, and do not limit the scope of the present disclosure. It is obvious to those having ordinary skill in the technical field to which the present disclosure pertains that in addition to the exemplary embodiments disclosed herein, various modifications may be implemented based on the technical spirit of the present disclosure.

What is claimed is:

1. A controller which controls a semiconductor memory device including a plurality of memory blocks, the controller comprising:
   a controller control unit configured to compare a read count value of an original memory block among the plurality of memory blocks with a predetermined copy generation reference value, determine whether to generate copy data of original data stored in the original memory block, and generate a command corresponding to the determination, for generating the copy data and storing the copy data in a copy memory block; and
   a storage unit configured to store the copy generation reference value and address information about the original memory block,
   wherein, when the read count value of the original memory block reaches a predetermined first reference value greater than the copy generation reference value, the controller control unit generates a command for reading the copy data stored in the copy memory block; and
   when a read count value of a second block reaches the first reference value, the controller control unit generates a command for reading the original data stored in the original memory block.

2. The controller of claim 1, wherein the storage unit may include:
   a reference value storage unit configured to store the copy generation reference value;
   a read count storage unit configured to store the read count value of the original memory block; and
   a map table configured to store the address information about the original memory block.

3. The controller of claim 2, wherein the controller control unit may include:
   a read count comparing unit configured to receive the copy generation reference value from the reference value storage unit, receive the read count value from the read count storage unit, and compare the copy generation reference value with the read count value;
   a map table control unit configured to store the address information in the map table and update the address information; and
   a command generating unit configured to generate the command for generating the copy data and storing the copy data in the copy memory block based on a result of the comparison of the read count comparing unit.

4. The controller of claim 3, wherein when the command generating unit generates the command for generating the copy data and storing the copy data in the copy memory block, the map table control unit stores address information about the copy memory block, in which the copy data is stored, in the map table.

5. The controller of claim 4, wherein the address information of the copy memory block is stored together with the address information of the original memory block.

6. The controller of claim 3,
   wherein the read count comparing unit compares the read count value of the original memory block with the predetermined first reference value, and
   wherein the map table control unit updates the map table to refer to the copy memory block, in which the copy data is stored, based on a result of the comparison.

7. The controller of claim 6,
   wherein the read count comparing unit compares the read count value of the copy memory block with the predetermined first reference value, and
   wherein the map table control unit updates the map table to refer to the original memory block, in which the original data is stored, based on a result of the comparison.

8. A method of operating a controller which controls a semiconductor memory device, the method comprising:
   controlling the semiconductor memory device to read data of a first block, and updating a read count value of the first block;
   controlling, when the read count value of the first block reaches a predetermined copy generation reference value, the semiconductor memory device to copy the data of the first block to a second block;
   controlling, when the read count value of the first block reaches a first reference value, the semiconductor memory device to read data of the second block; and
   controlling, when a read count value of the second block reaches the first reference value, the semiconductor memory device to read the data of the first block.

9. The method of claim 8, wherein the copy generation reference value is smaller than the first reference value.

10. The method of claim 8, wherein the controlling of the semiconductor memory device to copy the data of the first block to the second block when the read count value of the first block reaches the predetermined copy generation reference value includes storing address information about the second block in the map table.

11. The method of claim 8, wherein the controlling of the semiconductor memory device to read the data of the second block when the read count value of the first block reaches the first reference value includes reading data of the second block and updating the read count value of the second block together.

12. The method of claim 8, wherein the controlling of the semiconductor memory device to read the data of the first block when the read count value of the second block reaches the first reference value includes reading the data of the first block and updating the read count value of the first block.

13. A method of operating a controller which controls a semiconductor memory device, the method comprising:
    controlling the semiconductor memory device to read data of a first block, and updating a read count value of the first block;
    controlling, when the read count value of the first block reaches a predetermined copy generation reference value, the semiconductor memory device to copy the data of the first block to a second block;
    controlling, when the read count value of the first block reaches a first reference value, the semiconductor memory device to read data of the second block; and
    controlling, when a read count value of the second block reaches a second reference value that is larger than the first reference value, the semiconductor memory device to erase the data of the second block and read the data of first block.

14. The method of claim 13, wherein the copy generation reference value is smaller than the first reference value.

15. The method of claim 13, wherein the controlling of the semiconductor memory device to copy the data of the first block to the second block when the read count value of the first block reaches the predetermined copy generation reference value includes storing address information about the second block in the map table.

16. The method of claim 13, wherein the controlling of the semiconductor memory device to read the data of the second block when the read count value of the first block reaches the first reference value includes reading data of the second block and updating the read count value of the second block together.

17. The method of claim 13, wherein the controlling of the semiconductor memory device to erase the data of the second block and read the data of first block when the read count value of the second block reaches the second reference value that is larger than the first reference value includes performing an erase operation on the second block, and reading the data of the first block and updating the read count value of the first block together.

18. A memory system comprising:
    a memory device including first and second memory blocks; and
    a controller configured to control the memory device to copy an original data of the first memory block to the second memory block when a read count of the first memory block reaches a first reference value, and to alternately read one of the original data and the copy data whenever each read count of the first and second memory blocks reaches a second reference value,
    wherein the second reference value is greater than the first reference value.

* * * * *